US012703129B2

(12) United States Patent
Nasu et al.

(10) Patent No.: US 12,703,129 B2
(45) Date of Patent: Aug. 11, 2026

(54) PRESSURIZATION SYSTEM

(71) Applicant: NIKKISO CO., LTD., Tokyo (JP)

(72) Inventors: Keita Nasu, Tokyo (JP); Takahiro Mori, Tokyo (JP); Takahiro Morinaga, Tokyo (JP); Taku Nakamura, Tokyo (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 18/816,459

(22) Filed: Aug. 27, 2024

(65) Prior Publication Data

US 2025/0340024 A1 Nov. 6, 2025

(30) Foreign Application Priority Data

Oct. 11, 2023 (JP) ................................ 2023-175928

(51) Int. Cl.
*B29C 43/08* (2006.01)
*B29C 43/04* (2006.01)
(Continued)

(52) U.S. Cl.
CPC .............. *B29C 43/08* (2013.01); *B29C 43/04* (2013.01); *B29C 43/3607* (2013.01);
(Continued)

(58) Field of Classification Search
None
See application file for complete search history.

(56) References Cited

U.S. PATENT DOCUMENTS 5,188,652 A * 2/1993 Nakamura .............. C03B 11/08 65/319
9,943,990 B2 * 4/2018 Matsuzuki ............ C03B 11/125
2019/0139769 A1 5/2019 Mori et al.

FOREIGN PATENT DOCUMENTS

CN 119795654 A * 4/2025
JP H09219387 A * 8/1997
(Continued)

OTHER PUBLICATIONS

Notice of Reasons for Refusal, Japanese Patent App. No. 2023-175928, Jan. 9, 2024.
(Continued)

*Primary Examiner* — Benjamin A Schiffman
(74) *Attorney, Agent, or Firm* — WCF IP

(57) ABSTRACT

A pressurization system executes a pressurization process and related processes for a workpiece. The pressurization system includes a plurality of execution areas where any one of processes of the plurality of processes is executed and a chamber unit accommodating the workpiece and being conveyed through the executed areas. The execution areas are disposed according to an order in which the processes are executed. The chamber unit includes a ceiling portion disposed above the workpiece and that functions as an upper pressurizing unit pressurizing the workpiece from above in the pressurization process, a floor portion disposed below the workpiece and that functions as a lower pressurizing unit pressurizing the workpiece from below in the pressurization process, and a peripheral wall portion disposed to surround the entire perimeter of the workpiece and that defines, together with the ceiling portion and the floor portion, an accommodating chamber where the workpiece is accommodated.

12 Claims, 22 Drawing Sheets

(51) Int. Cl.
*B29C 43/36* (2006.01)
*B29C 43/52* (2006.01)
*H10P 72/00* (2026.01)
*B29C 43/56* (2006.01)

(52) U.S. Cl.
CPC .......... *B29C 43/52* (2013.01); *H10P 72/0462* (2026.01); *B29C 2043/046* (2013.01); *B29C 2043/3689* (2013.01); *B29C 2043/563* (2013.01)

(56) References Cited

FOREIGN PATENT DOCUMENTS

| | | | |
|---|---|---|---|
| JP | 2007-000896 | A | 1/2007 |
| JP | 2008-120613 | A | 5/2008 |
| JP | 2010-062468 | A | 3/2010 |
| JP | 2017-199812 | A | 11/2017 |

OTHER PUBLICATIONS

Notice of Reasons for Refusal, Japanese Patent App. No. 2023-175928, Aug. 13, 2024.

* cited by examiner

20
D
C
B
A22
A23
A24
E
A
A21
A26
A25

E
D
C
A
B
22

PRESSURIZATION SYSTEM

FIELD OF THE INVENTION

The present invention relates to a pressurization system.

BACKGROUND

A pressurization apparatus is conventionally used to pressurize a workpiece to be pressed (e.g., electronic components, etc.,). For example, the pressurization apparatus disclosed in PTL 1 includes an upper pressurizing unit and a lower pressurizing unit, holds and pressurizes a workpiece by the upper pressurizing unit and the lower pressurizing unit, and also heats the workpiece by a heating unit included in the lower pressurizing unit. In the pressurization apparatus, after the workpiece has been pressurized and heated, the workpiece is cooled while still pressurized, and the workpiece is removed after cooling. In the pressurization apparatus, the workpiece is heated and cooled by one heating unit. Thus, it takes time to switch between heating and cooling by the heating unit, and the processing time for each pressurization process is prolonged.

In the pressurization apparatus disclosed in PTL 2, a lower pressurizing unit includes a heating unit that is heated in advance and a cooling unit that is cooled in advance. The heating unit and the cooling unit are configured to be movable with respect to the upper pressurizing unit holding a workpiece, and the heating unit and the cooling unit are appropriately switched depending on a progress of the pressurization process. Thus, the time for switching between heating and cooling by the lower pressurizing unit is shortened, and the processing time is also shortened.

In the pressurization apparatus disclosed in JP2007 896A and JP2017 199812A, the workpiece is sandwiched between the upper pressurizing unit and the lower pressurizing unit while each process (heating, pressurizing, and cooling) for the workpiece is executed. Therefore, from the start until the completion of each process, the pressurization apparatus is a dedicated machine for only the workpiece in process. As a result, during the pressurization process, a workpiece for the next pressurization process cannot be set in the pressurization apparatus. That is, a long time is required between each pressurization process.

SUMMARY

Herein, preheating process is executed for the workpiece as preprocessing of the pressurization process, thereby expecting the processing time to be shortened. The processing time is also expected to be shortened by separating the cooling process from the pressurization process and executing the cooling process to the workpiece as post-processing of the pressurization process. In this way, the processes related to the pressurization process (hereinafter referred to as "related process") can be executed by the pressurization apparatus, thereby the processing time in the pressurization apparatus is shortened and the time between each pressurization process can also be shortened. However, the execution of the related processes in the pressurization apparatus is not easy. Even though the related processes can be executed, the workpiece is sealed only during the pressurization process in the pressurization apparatus, and thus the workpiece during the related processes is exposed to the atmosphere and the workpiece may be oxidized. Thus, a chamber for related processes and a large amount of inert gas (e.g., nitrogen gas) that fills the chamber are required.

The present invention is directed to provide a pressurization system capable of shortening the time between each pressurization process and executing related processes of the pressurization process.

A pressurization system in one aspect of the present invention is a pressurization system that executes a pressurization process for a workpiece and a related process related to the pressurization process, the system including a plurality of execution areas in which any one of a plurality of processes including the pressurization process and the related process is executed, and a chamber unit that accommodates the workpiece and is conveyed through the plurality of execution areas, in which the plurality of execution areas is disposed according to an order in which the processes are executed, and the chamber unit includes a ceiling portion that is disposed above the workpiece and functions as an upper pressurizing unit that pressurizes the workpiece from above in the pressurization process, a floor portion that is disposed below the workpiece and functions as a lower pressurizing unit that pressurizes the workpiece from below in the pressurization process, and a peripheral wall portion that is disposed in such a way as to surround the entire perimeter of the workpiece and defines, together with the ceiling portion and the floor portion, an accommodating chamber in which the workpiece is accommodated.

The present invention is able to provide the pressurization system capable of shortening the time between each pressurization process and executing the related processes of the pressurization process.

DESCRIPTION OF THE DRAWINGS

FIG. 20 is a schematic plan view of the plurality of chamber units in FIG. 5 illustrating positions of each chamber unit on a time-series basis.

DETAILED DESCRIPTION

Figure 1:
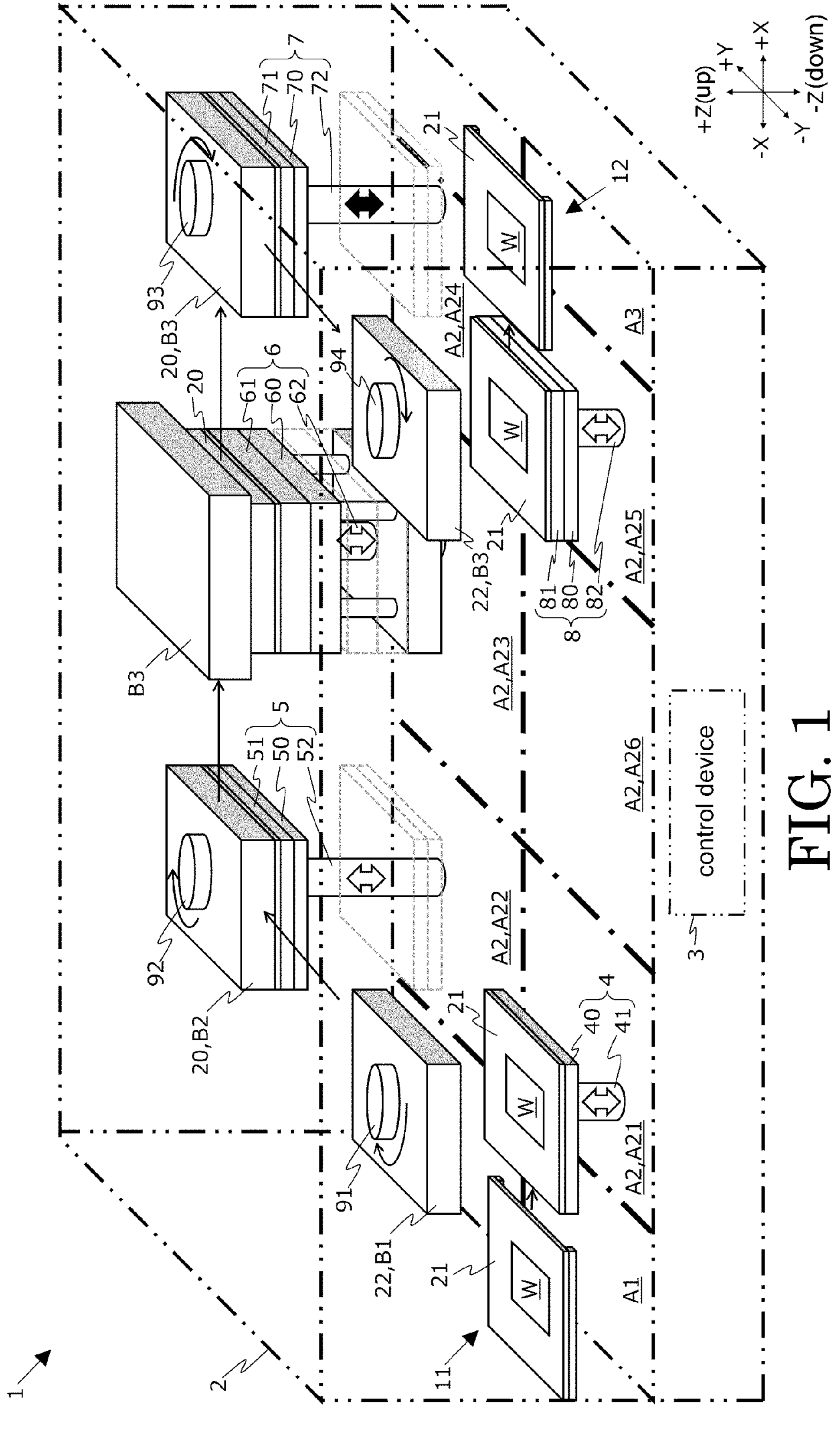
FIG. 1 is a schematic perspective view of a pressurization system illustrating an embodiment of the pressurization system according to the present invention.

Embodiments of a pressurization system according to the present invention (hereinafter referred to as "present system") will be described below. In the following description, the drawings are referred to as appropriate. In the drawings, the same members and components are indicated with the same reference signs, and repetitive description thereof will be omitted. The dimensional ratios of the components may be exaggerated for convenience of description and are not limited to the ratios illustrated in the drawings.

In the following description and drawings, unless otherwise specified, assuming that three axes orthogonal to one another in space are defined as an X axis, a Y axis, and a Z axis, the "X-axis direction" is the direction along the X axis, which is a left-right direction, for example. The "Y-axis direction" is the direction along the Y-axis, which is a front-rear direction, for example. The "Z-axis direction" is the direction along the Z-axis, which is a vertical direction. The "+X-axis direction" is to the left, the "−X-axis direction" is to the right, the "+Y-axis direction" is forward, the "−Y-axis direction" is backward, the "+Z-axis direction" is upward, and the "−Z-axis direction" is downward. In the following description, the X-axis direction (+X-axis direction, −X-axis direction) and the Y-axis direction (+Y-axis direction, −Y-axis direction) are mainly used for specifying directions other than the vertical direction.

In the present invention, a function for executing processes related to the pressurization process (hereinafter referred to as "related process") is added to the pressurization apparatus, thereby configuring the present system to execute a plurality of the processes including the pressurization process. A chamber unit, which accommodates a workpiece, is formed by a part of an upper pressurizing unit that pressurizes the workpiece in the pressurization process and a part of a lower pressurizing unit. The chamber unit moves through a plurality of execution areas disposed in the present system, and the process corresponding to each execution area is executed for the workpiece. As a result, the present invention is able to execute the plurality of related processes for the workpiece by moving the chamber unit. The present invention is able to shorten the time between each pressurization process by moving the chamber unit after the pressurization process is executed. A description of each term and a specific configuration of each component will be described later.

The "pressurization process" is a process for applying pressure to the workpiece from above and below and executing predetermined processing (e.g., compression, pressure welding, sintering bonding, etc.,) to the workpiece. The pressurization process includes a process in which only pressurizing is executed and a process in which pressurizing and heating are executed.

The "workpiece" is an object to be pressurized in the present system (i.e., a target for pressurization), and is a sheet-shaped substrate (such as a ceramic green sheet), a substrate on which an electronic component, a circuit, and the like are mounted, for example.

The "related process" is a process related to the pressurization process in the present system and includes preprocessing necessary for the workpiece to execute the pressurization process (e.g., assembly of the chamber unit, accommodation of the workpiece into the chamber unit, preheating of the workpiece, etc.,) and post-processing necessary for the workpiece after the pressurization process is executed (e.g., cooling of the workpiece, removal of the workpiece from the chamber unit, etc.,). In the present embodiment, the related processes include, as preprocessing of the pressurization process, an accommodation process and the preheating process, and include, as a post-processing of the pressurization process, a primary cooling process, a secondary cooling process, and a removal process. The condition of the chamber unit is related to success or failure of the pressurization process, and thus a maintenance process of the chamber unit (an upper unit described later) is also included in the related processes.

Pressurization System

Configuration of Pressurization System

Figure 2:
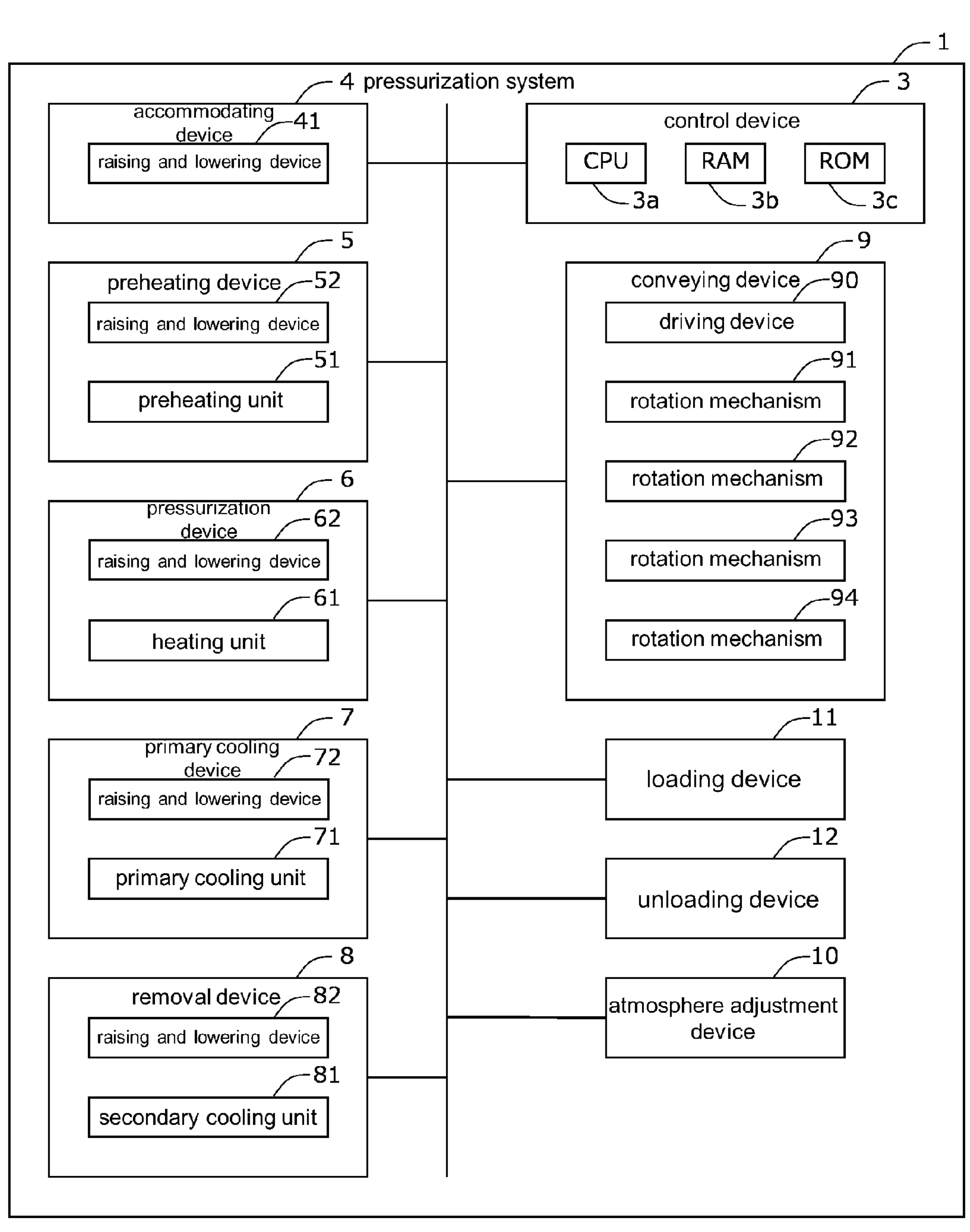
FIG. 2 is a functional block diagram of the pressurization system in FIG. 1.

FIG. 1 is a schematic perspective view of the present system 1 illustrating an embodiment of the present system 1. FIG. 2 is a functional block diagram of the present system 1. In FIG. 1, a boundary of each area described later is indicated by thick dash-dotted lines.

The present system 1 executes the pressurization process and the related processes for the workpiece W. The present system 1 includes a housing 2, a control device 3, an accommodating device 4, a preheating device 5, a pressurization device 6, a primary cooling device 7, a removal device 8, a conveying device 9, an atmosphere adjustment device 10, a loading device 11, an unloading device 12, and a plurality of chamber units 20 (the number of chamber units is five in the present embodiment).

The housing 2 accommodates the control device 3, the accommodating device 4, the preheating device 5, the pressurization device 6, the primary cooling device 7, the removal device 8, the conveying device 9, the atmosphere adjustment device 10, the loading device 11, the unloading device 12, and the chamber units 20. When viewed in plan view, the housing 2 has a rectangular shape along the X-axis direction and the Y-axis direction (hereinafter referred to as "XY-axis direction") and has a hollow cuboid shape. The housing 2 is disposed on a horizontal floor surface. In the following description, the "horizontal direction" is the direction parallel to the floor surface, which is the direction parallel to the XY-axis direction. The horizontal direction includes not only a complete horizontal but also slight slope of the floor surface and errors (slight slope) due to manufacturing tolerance and assembly tolerance of each component included in the present system 1.

When viewed from above, the internal space of the housing 2 is divided into a loading area A1, a plurality of execution areas A2, and an unloading area A3. In other words, the present system 1 includes the loading area A1, the plurality of execution areas A2, and the unloading area A3. In the present specification, when the loading area A1, the plurality of execution areas A2, and the unloading area A3 are not particularly distinguished, they will be simply referred to as "area".

The "loading area A1" is an area where a loading process for loading the workpiece W toward the execution area A2 is executed.

The "execution area A2" is an area where any one of the pressurization process and related processes is executed. The execution areas A2 include a plurality of execution areas A21 to A26 each corresponding to each of the pressurization process and related processes.

The "execution area A21" is an area where the accommodation process is executed and is an example of an accommodation area in the present invention. The "execution area A22" is an area where the preheating process is executed and is an example of a preheating area in the present invention. The "execution area A23" is an area where the pressurization process is executed and is an example of a pressurization area in the present invention. The "execution area A24" is an area where the primary cooling process is executed and is an example of a cooling area in the present invention. The "execution area A25" is an area where the secondary cooling process and the removal process are executed and is an example of the cooling area and a removal area in the present invention. The "execution area A26" is an area where the maintenance process is executed and is an example of a maintenance area in the present invention. The "unloading area A3" is an area where the unloading process for unloading, from the execution area, the workpiece W after the pressurization process is executed.

When viewed from above, the execution areas A2 are disposed between the loading area A1 and the unloading area A3. The execution areas A21 to A26 are disposed in a rectangular annular shape in a clockwise direction when viewed from above, according to an order in which the processes for the workpiece W and for an upper unit 22 described later are executed (see FIG. 5, the same applies below). Specifically, the execution area A21 is disposed adjacent to the loading area A1 on the +X-axis direction side, the execution area A22 is disposed adjacent to the execution area A21 on the +Y-axis direction side, the execution area A23 is disposed adjacent to the execution area A22 on the +X-axis direction side, the execution area A24 is disposed adjacent to the execution area A23 on the +X-axis direction side, the execution area A25 is disposed adjacent to the execution area A24 on the −Y-axis direction side, the execution area A26 is disposed adjacent to the execution area A25 on the −X-axis direction side and the execution area A21 on the +X-axis direction side, and the unloading area A3 is disposed adjacent to the execution area A25 on the +X-axis direction side. That is, in the X-axis direction, the execution area A23 is disposed between the execution areas A22 and A24, and the execution area A26 is disposed between the execution areas A21 and A25.

The control device 3 controls the operation of the whole present system 1. The control device 3 includes a processor such as a central processing unit (CPU) 3*a*, a volatile memory such as a random access memory (RAM) 3*b* that functions as a working area for the CPU 3*a*, and a non-volatile memory such as a read only memory (ROM) 3*c* that stores various kinds of information such as a control program, for example.

Figure 3:
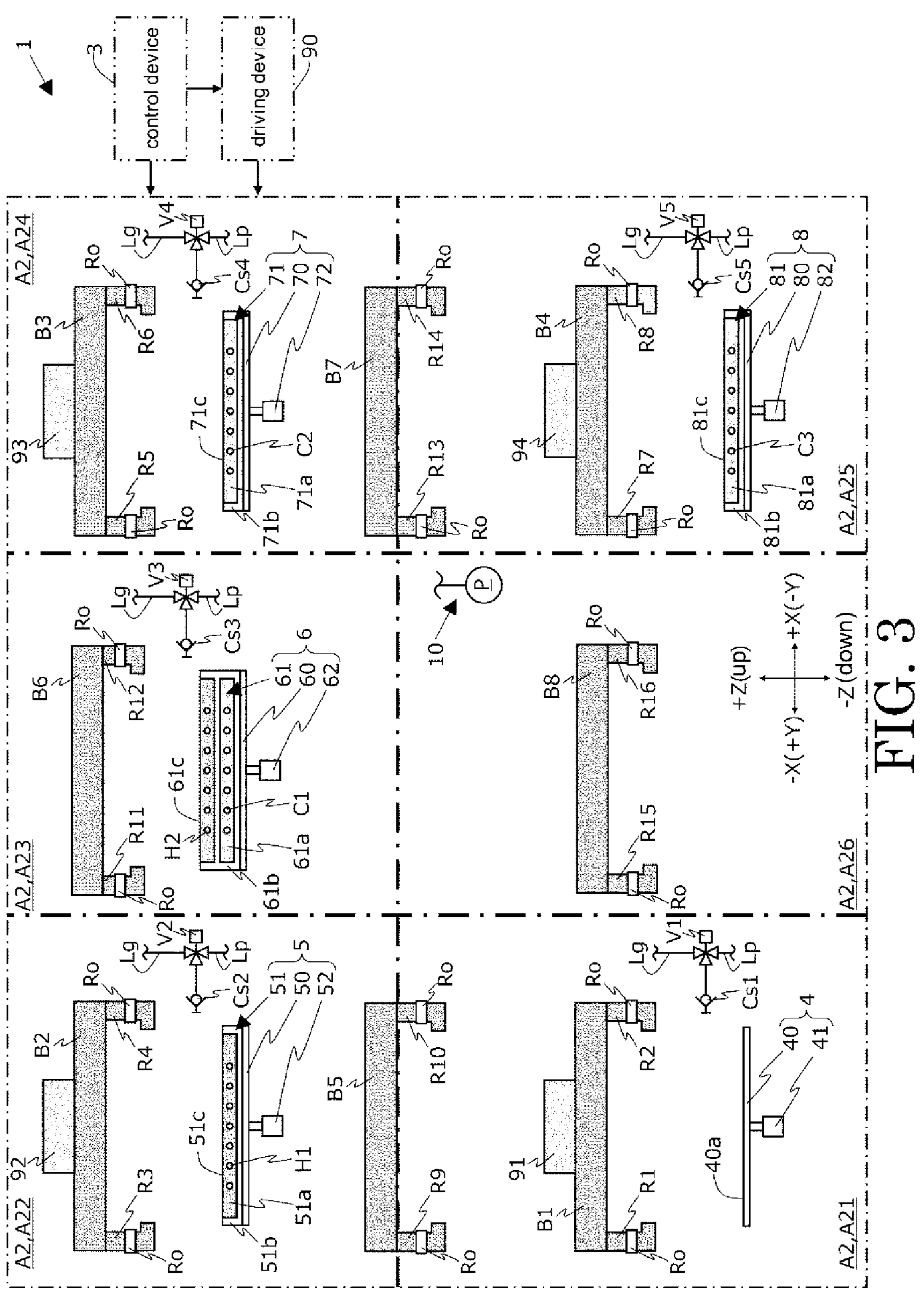
FIG. 3 is a schematic sectional view of each device disposed in each execution area included in the pressurization system in FIG. 1 illustrating a main configuration of each device.

FIG. 3 is a schematic sectional view of each device disposed in each of the execution areas A21 to A26 illustrating the main configuration of each device. The figure illustrates a schematic sectional view of each device when viewed in a direction (the X-axis direction or the Y-axis direction) to which rail members R1 to R16 described later disposed in the execution areas A21 to A26 are directed.

The accommodating device 4 attaches the placement table 21 on which the workpiece W is placed to the upper unit 22, thereby assembling the chamber unit 20 and accommodating the workpiece W in the chamber unit 20. The accommodating device 4 includes a table 40 and a raising and lowering device 41. The accommodating device 4 is disposed in the execution area A21. Details of the placement table 21 and the upper unit 22 will be described later.

The table 40 is a table on which the placement table 21 is placed. The table 40 has a rectangular shape along the XY-axis direction when viewed from above, which is a plate shape, for example. The upper surface 40*a* of the table 40 is a flat shape parallel to the horizontal direction.

The raising and lowering device 41 raises and lowers the table 40. The raising and lowering device 41 is a known cylinder, for example.

The preheating device 5 heats the workpiece W accommodated in the chamber unit 20 to a preheating temperature described later. The preheating device 5 includes a table 50, a preheating unit 51, and a raising and lowering device 52. The preheating device 5 is disposed in the execution area A22.

The table 50 is a table on which the preheating unit 51 is placed. The table 50 has a rectangular shape along the XY-axis direction when viewed from above, which is a plate shape, for example.

The preheating unit 51 is disposed above the table 50 and is attached to the table 50. The preheating unit 51 includes a main body 51*a*, a thermal insulation member 51*b*, and a plurality of heaters H1. The main body 51*a* protects the heaters H1. The main body 51*a* is made of metal (e.g., copper alloy) having high thermal conductivity, for example. The main body 51*a* has a rectangular shape along the XY-axis direction when viewed from above and has a cuboid shape, for example. The thermal insulation member 51*b* covers the perimeter of the main body 51*a* (the entire perimeter in the horizontal direction and the downward direction, the same applies below), eliminating the leakage of heat from the heaters H1 to the surroundings. The heaters H1 are disposed inside the main body 51*a*. An upper surface 51*c* of the preheating unit 51 has a flat shape parallel to the horizontal direction.

The raising and lowering device 52 raises and lowers the table 50 and the preheating unit 51. The raising and lowering device 52 is a known cylinder, for example.

The pressurization device 6 pressurizes the workpiece W accommodated in the chamber unit 20. The pressurization device 6 includes a lower base member 60, a heating unit 61, and a raising and lowering device 62. The pressurization device 6 is disposed in the execution area A23.

The lower base member 60 supports the heating unit 61. The lower base member 60 is made of metal (e.g., stainless steel) having high rigidity, for example. The lower base member 60 has a rectangular shape along the XY-axis direction when viewed from above and has a cuboid shape, for example.

The heating unit 61 is disposed above the lower base member 60 and is attached to the lower base member 60. The heating unit 61 includes a main body 61*a*, a thermal insulation member 61*b*, a plurality of heaters H2, and a plurality of coolant flow paths C1. The main body 61*a* protects the heaters H2 and the coolant flow paths C1. The main body 61*a* is made of metal (e.g., carbon steel) having high rigidity, for example. The main body 61*a* has a rectangular shape along the XY-axis direction when viewed from above and has a cuboid shape. The thermal insulation member 61*b* is disposed in such a way as to cover the perimeter of the main body 61*a* and also to divide the main body 61*a* into two parts, i.e., upper and lower half portions. The thermal insulation member 61*b* eliminates the leakage of the heat from the heaters H2 to the surroundings and the condensation on the main body 61*a*. The heaters H2 heat the workpiece W when the workpiece W is pressurized. The heaters H2 are disposed in the upper half portion of the main body 61*a*. The coolant flow path C1 is a path through which coolant (not illustrated, the same applies below) for cooling the lower half portion of the main body 61*a* flows. The coolant is cooled by a cooling device (not illustrated, the same applies below) and circulated through the coolant flow path C1 and the cooling device. The coolant flow paths C1 are disposed in the lower half portion of the main body 61*a*. The heating unit 61 is attached on the lower base member 60. The heating unit 61 is an example of a pressurizing unit and a heating unit in the present invention. An upper surface 61*c* of the heating unit 61 has a flat shape parallel to the horizontal direction.

The raising and lowering device 62 raises and lowers the lower base member 60 and the heating unit 61. The raising and lowering device 62 is a known hydraulic cylinder, for example.

The primary cooling device 7 cools the workpiece W after heating accommodated in the chamber unit 20. The primary cooling device 7 includes a table 70, a primary cooling unit 71, and a raising and lowering device 72. The primary cooling device 7 is disposed in the execution area A24.

The table 70 is a table on which the primary cooling unit 71 is placed. The table 70 has a rectangular shape along the XY-axis direction when viewed from above and has a plate shape, for example.

The primary cooling unit 71 is disposed above the table 70 and is attached to the table 70. The primary cooling unit 71 includes a main body 71*a*, a thermal insulation member 71*b*, and a plurality of coolant flow paths C2. The main body 71*a* protects the coolant flow paths C2. The main body 71*a* is made of metal (e.g., copper alloy) having high thermal conductivity, for example. The main body 71*a* has a rectangular shape along the XY-axis direction when viewed from above and has a cuboid shape, for example. The thermal insulation member 71*b* covers the perimeter of the main body 71*a* and eliminates the condensation on the main body 71*a*. The coolant flow path C2 is a flow path through which the coolant flows. The coolant is cooled by a cooling device and circulated through the coolant flow path C2 and the cooling device. An upper surface 71*c* of the primary cooling unit 71 is a flat shape parallel to the horizontal direction. The primary cooling unit 71 is an example of a cooling unit in the present invention.

The raising and lowering device 72 raises and lowers the table 70 and the primary cooling unit 71. The raising and lowering device 72 is a known cylinder, for example.

The removal device 8 cools the workpiece W accommodated in the chamber unit 20 and also removes the workpiece W from the chamber unit 20. The removal device 8 includes a table 80, a secondary cooling unit 81, and a raising and lowering device 82. The removal device 8 is disposed in the execution area A25.

The table 80 is a table on which the secondary cooling unit 81 is placed. The table 80 has a rectangular shape along the XY-axis direction when viewed from above and has a plate shape, for example.

The secondary cooling unit 81 is disposed above the table 80 and is attached to the table 80. The secondary cooling unit 81 includes a main body 81*a*, a thermal insulation member 82*b*, and a plurality of coolant flow paths C3. The main body 81*a* protects the coolant flow paths C3. The main body 81*a* is made of metal (e.g., copper alloy) having high thermal conductivity, for example. The main body 81*a* has a rectangular shape along the XY-axis direction when viewed from above and has a cuboid shape, for example. A thermal insulation member 81*b* covers the perimeter of the main body 81*a* and eliminates the condensation on the main body 81*a*. The coolant flow path C3 is a flow path through which the coolant flows. The coolant is cooled by a cooling device and circulated through the coolant flow path C3 and the cooling device. An upper surface 81*c* of the secondary cooling unit 81 is a flat shape parallel to the horizontal direction. The secondary cooling unit 81 is an example of a cooling unit in the present invention.

The raising and lowering device 82 raises and lowers the table 80 and the secondary cooling unit 81. The raising and lowering device 82 is a known cylinder, for example.

Figure 4:
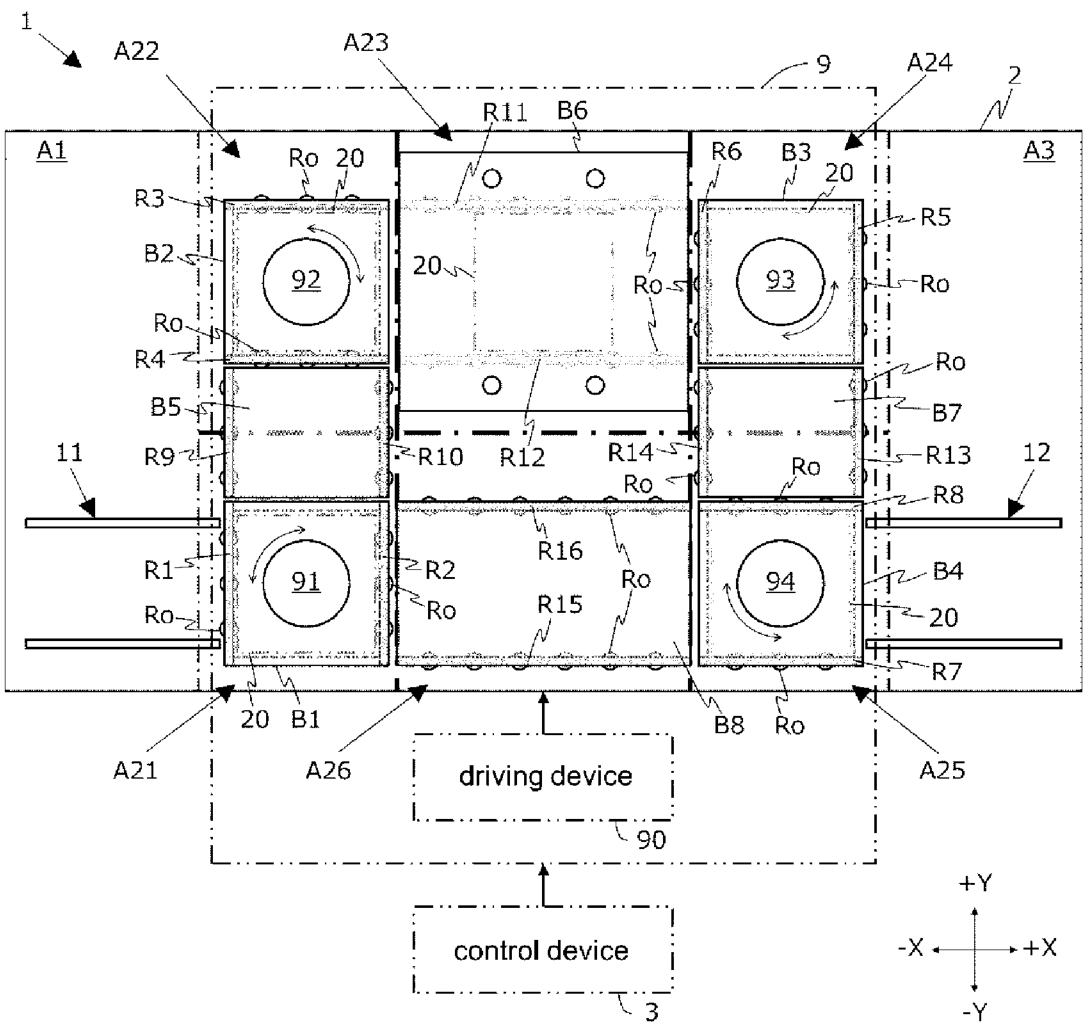
FIG. 4 is a schematic plan view of the pressurization system in FIG. 1.

FIG. 4 is a schematic plan view of the present system 1. In the figure, the conveying device 9, the loading device 11, and the unloading device 12 are mainly illustrated for convenience of description. In the figure, base members B1 to B8 described later are illustrated in a translucent state, and the chamber unit 20 is illustrated with two dot chain lines. In the following description, FIGS. 1 to 3 will be referred to as appropriate.

The conveying device 9 conveys the chamber unit 20 and the upper unit 22. The conveying device 9 includes a plurality of rail members R1, R2, R3, R4, R5, R6, R7, R8, R9, R10, R11, R12, R13, R14, R15, and R16 (the number of the rail members is 16 in the present embodiment), a plurality of base members B1, B2, B3, B4, B5, B6, B7, and B8 (the number of the base members is eight in the present embodiment), a plurality of rollers Ro, a driving device 90, and four rotation mechanisms 91, 92, 93, and 94. The rotation mechanisms 91 to 94 are examples of a direction changing mechanism in the present invention.

The rail members R1 to R16 support the chamber unit 20 in such a way that the chamber unit 20 is movable in the horizontal direction (the X-axis direction or the Y-axis direction). Each of the rail members R1 to R16 has an elongated shape along the X-axis direction or the Y-axis direction, for example. The lower end portion of each of the rail members R1 to R16 protrudes toward one side in the shorter direction, and each of the rail members R1 to R16 has a "L" shape when viewed along the longitudinal direction of each of the rail members R1 to R16. The rail members R1 to R16 are designed to have a strength capable of supporting the chamber unit 20 that is a heavy object. In the following description, when the rail members R1 to R16 are not particularly distinct from one another, the rail members R1 to R16 will be simply referred to as "rail member R". It is assumed that the rail member R is directed in the X-axis direction when the longitudinal direction of the rail member R is along the X-axis direction, and the rail member R is directed in the Y-axis direction when the longitudinal direction is along the Y-axis direction.

The base members B1 to B8 support the corresponding rail members R1 to R16. Each of the base members B1 to B8 has a rectangular shape along the XY-axis direction when viewed from above and has a cuboid shape. The rail members R1 to R16 are attached on the lower surfaces of two parallel sides out of four sides of the corresponding base members B1 to B8 in such a way that the protruding portions face each other.

The base member B1 supports the rail members R1 and R2. The base member B1 is disposed above the table 40 in the execution area A21, i.e., in the upper space in the execution area A21. The base member B1 is attached to a ceiling of the housing 2 (not illustrated, the same applies below) via the rotation mechanism 91.

The base member B2 supports the rail members R3 and R4. The base member B2 is disposed above the preheating unit 51 in the execution area A22, i.e., in the upper space in the execution area A22. The base member B2 is attached to the ceiling of the housing 2 via the rotation mechanism 92.

The base member B3 supports the rail members R5 and R6. The base member B3 is disposed above the primary cooling unit 71 in the execution area A24, i.e., in the upper space in the execution area A24. The base member B3 is attached to the ceiling of the housing 2 via the rotation mechanism 93.

The base member B4 supports the rail members R7 and R8. The base member B4 is disposed above the secondary cooling unit 81 in the execution area A25, i.e., in the upper space in the execution area A25. The base member B4 is attached to the ceiling of the housing 2 via the rotation mechanism 94.

The base member B5 supports the rail members R9 and R10. The base member B5 is disposed between the base members B1 and B2 in the execution areas A21 and A22. That is, the base member B5 is disposed in the upper space in the execution areas A21 and A22. The base member B5 is attached to the ceiling of the housing 2.

The base member B6 supports the rail members R11 and R12. The base member B6 is disposed above the heating unit 61 in the execution area A23, i.e., in the upper space in the execution area A23. The base member B6 is attached to the ceiling of the housing 2. As described later, predetermined pressing force is applied to the base member B6 in the pressurization process, and thus the base member B6 is designed to have the strength capable of withstanding the pressing force. The base member B6 constitutes an upper pressurizing unit 6U (see FIG. 13, the same applies below) in the pressurization process, together with a portion of the upper unit 22.

The base member B7 supports the rail members R13 and R14. The base member B7 is disposed between the base members B3 and B4 in the execution areas A24 and A25. That is, the base member B7 is disposed in the upper space in the execution areas A24 and A25. The base member B7 is attached to the ceiling of the housing 2.

The base member B8 supports the rail members R15 and R16. The base member B8 is disposed between the base members B1 and B4 in the execution area A26. That is, the base member B8 is disposed in the upper space in the execution area A26. The base member B8 is attached to the ceiling of the housing 2.

The driving device 90 generates power for conveying the chamber units 20 and transmits the power to the roller Ro. The driving device 90 includes one or more power sources (e.g., a motor), and a plurality of power transmission mechanisms (e.g., gears, ball screws, etc.,), for example.

The rotation mechanisms 91 to 94 rotate the corresponding base members B1 to B4. The rotation mechanisms 91 to 94 each include a motor and a plurality of gears and each rotation mechanism is configured to be rotatable about the Z axis as the rotating shaft thereof, for example.

The rotation mechanism 91 is disposed between the ceiling of the housing 2 and the base member B1. The rotation mechanism 91 rotates the base member B1 in such a way that the orientation of the rail members R1 and R2 is directed in any one of the X-axis direction and the Y-axis direction. In other words, the rotation mechanism 91 changes the moving direction of the chamber unit 20 guided by the rail members R1 and R2 between the X-axis direction and the Y-axis direction.

The rotation mechanism 92 is disposed between the ceiling of the housing 2 and the base member B1. The rotation mechanism 92 rotates the base member B2 in such a way that the orientation of the rail members R3 and R4 is directed in any one of the X-axis direction and the Y-axis direction. In other words, the rotation mechanism 92 changes the moving direction of the chamber unit 20 guided by the rail members R3 and R4 between the X-axis direction and the Y-axis direction.

The rotation mechanism 93 is disposed between the ceiling of the housing 2 and the base member B3. The rotation mechanism 93 rotates the base member B3 in such a way that the orientation of the rail members R5 and R6 is directed in any one of the X-axis direction and the Y-axis direction. In other words, the rotation mechanism 93 changes the moving direction of the chamber unit 20 guided by the rail members R5 and R6 between the X-axis direction and the Y-axis direction.

The rotation mechanism 94 is disposed between the ceiling of the housing 2 and the base member B4. The rotation mechanism 94 rotates the base member B4 in such a way that the orientation of the rail members R7 and R8 is directed in any one of the X-axis direction and the Y-axis direction. In other words, the rotation mechanism 94 changes the moving direction of the chamber unit 20 guided by the rail members R7 and R8 between the X-axis direction and the Y-axis direction.

In this way, each of the base members B1 to B4 is a rotating base member capable of rotating about the Z axis as the rotating shaft thereof. In contrast, each of the base members B5 to B8 is a non-rotatable fixed base member.

Note that, in the present invention, the configuration of the conveying device 9 may be any configuration that allows the chamber unit 20 and the upper unit 22 to be conveyed through the execution areas A21 to A26 and is not limited to the configuration in the present embodiment.

The atmosphere adjustment device 10 adjusts atmosphere in an accommodating chamber 20R described later. The atmosphere adjustment device 10 includes a vacuum pump P, a pressure reducing line Lp, a gas line Lg, a plurality of valves V1, V2, V3, V4, and V5 (the number of valves is five in the present embodiment), and a plurality of fixed connector Cs1, Cs2, Cs3, Cs4, and Cs5 (the number of fixed connectors is five in the present embodiment). The atmosphere adjustment device 10 is configured to be able to adjust the atmosphere of the accommodating chamber 20R to a depressurized atmosphere (vacuum atmosphere) or an inert gas atmosphere.

The vacuum pump P adjusts the atmosphere in the accommodating chamber 20R to the depressurized atmosphere (the vacuum atmosphere). The vacuum pump Pis a known vacuum pump. The vacuum pump P is connected to the fixed connectors Cs1 to Cs5 via the pressure reducing line Lp and the valves V1 to V5.

The pressure reducing line Lp is piping connected to the vacuum pump P. The gas line Lg is piping connected to a supply pipe (not illustrated, the same applies below) for inert gas (e.g., nitrogen gas). The pressure reducing line Lp and the gas line Lg are branched into a plurality of branch lines (at least five branch lines in the present embodiment), and each branch line is connected to the corresponding fixed connectors Cs1 to Cs5 via the corresponding valves V1 to V5. The valves V1 to V5 are known solenoid valves that switch the connection of the pressure reducing line Lp and the gas line Lg with respect to the fixed connectors Cs1 to Cs5.

The fixed connectors Cs1 to Cs5 are joints for piping to which a movable connector Cp described later is connected. The fixed connectors Cs1 to Cs5 are known check valve coupling sockets, for example. The fixed connector Cs1 is disposed in the execution area A21, the fixed connector Cs2 is disposed in the execution area A22, the fixed connector Cs3 is disposed in the execution area A23, the fixed connector Cs4 is disposed in the execution area A24, and the fixed connector Cs5 is disposed in the execution area A25. The fixed connectors Cs1 to Cs5 are configured to close even under the depressurized atmosphere when the connection with the movable connector Cp is released.

Note that, in the present invention, the fixed connectors Cs1 to Cs5 may be disposed in the execution areas A21 to A25 via a mechanism, e.g., a floating mechanism, that absorbs and relaxes an impact from the movable connector Cp accompanying the convey of the chamber unit 20. The fixed connectors Cs1 to Cs5 may be disposed in the execution areas A21 to A25 in such a way as to be able to move forward and backward toward the movable connector Cp after the convey of the chamber unit 20 ends.

The loading device 11 conveys the placement table 21 on which the workpiece W is placed into the accommodating device 4 (the table 40) in the execution area A21. The loading device 11 includes a slide rail and a motor that operates the slide rail, for example.

The unloading device 12 unloads, from the removal device 8 (the secondary cooling unit 81) in the execution area A25, the placement table 21 on which the pressurized workpiece W is placed. The unloading device 12 includes a slide rail and a motor that operates the slide rail, for example.

Configuration of Chamber Unit

Figure 5:
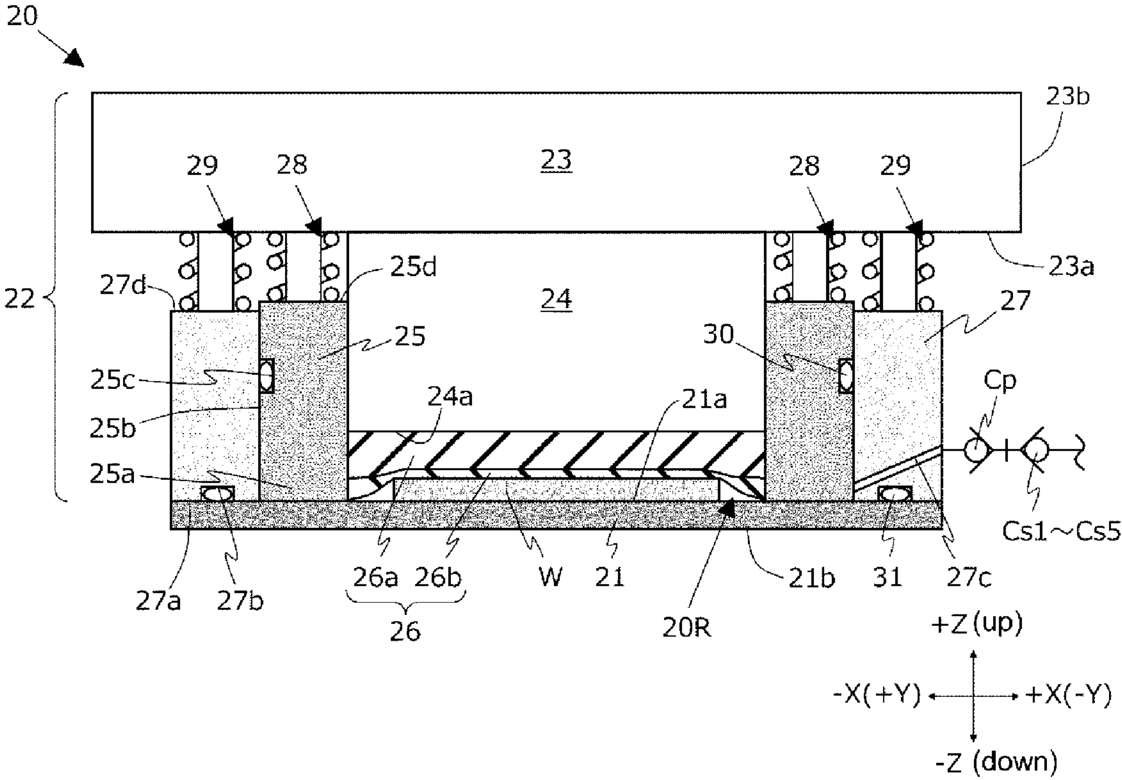
FIG. 5 is a schematic plan view of a chamber unit included in the pressurization system in FIG. 1.

FIG. 5 is a schematic sectional view of the chamber unit 20.

The chamber unit 20 accommodates the workpiece W and is conveyed through the execution areas A21 to A25. The chamber unit 20 includes the placement table 21, the upper unit 22, and the accommodating chamber 20R.

The placement table 21 conveys the workpiece W and defines the accommodating chamber 20R. As described later, the placement table 21 functions as a conveyor plate for the workpiece W and also functions as a lower pressurizing unit 6D (see FIG. 13, the same applies below) when the workpiece W is pressurized. The placement table 21 is made of metal (e.g., copper alloy) having high thermal conductivity, for example. The placement table 21 has a rectangular shape along the XY-axis direction when viewed from above and has a plate shape. The placement table 21 has the strength sufficient to be able to withstand the force applied in the operations of the present system 1 described later and also has a thickness such that the heat capacity of the placement table 21 is relatively small when the workpiece W is heated and cooled. An upper surface 21*a* and a lower surface 21*b* of the placement table 21 has a flat shape parallel to the horizontal direction. The placement table 21 is configured to be attachable to and detachable from the upper unit 22 (a side member 27).

The upper unit 22 covers the workpiece W from above. The upper unit 22 includes a base member 23, an upper mold 24, a frame member 25, a pressurizing pad 26, a side member 27, first spring members 28, second spring members 29, two sealing members 30 and 31, and the movable connector Cp. As described later, the base member 23, the upper mold 24, and the pressurizing pad 26 function as the upper pressurizing unit 6U when the workpiece W is pressurized.

The base member 23 supports the upper mold 24, the first spring members 28, and the second spring members 29. The base member 23 is made of metal (e.g., stainless steel) having high rigidity, for example. The base member 23 has a rectangular shape along the XY-axis direction when viewed from above and has a vertically flat cuboid shape.

The upper mold 24 pressurizes the workpiece W from above via the pressurizing pad 26. The upper mold 24 is made of metal (e.g., stainless steel) having high rigidity, for example. The upper mold 24 is disposed below the base member 23 and is attached to a lower surface 23*a* of the base member 23. The upper mold 24 has a rectangular shape smaller than the base member 23 and extending along the XY-axis direction when viewed from below and has a cuboid shape. A lower surface 24*a* of the upper mold 24 has a flat shape parallel to the horizontal direction.

Note that, in the present invention, the upper mold 24 may be integrally formed with the base member 23.

The frame member 25 holds the pressurizing pad 26. The frame member 25 is made of metal (e.g., stainless steel) having high rigidity, for example. When viewed from below, the frame member 25 has a rectangular shape along the XY-axis direction and has a frame shape. That is, when viewed from below, a rectangular internal space is defined at the center of the frame member 25. In the horizontal direction, the frame member 25 is disposed to surround the upper mold 24. That is, the upper mold 24 is disposed in the internal space. In the vertical direction, a lower end portion 25*a* of the frame member 25 is located below the lower surface 24*a* of the upper mold 24. The frame member 25 is supported by the base member 23 to allow relative vertical movement with respect to the upper mold 24 via the first spring members 28. The frame member 25 includes a groove portion 25*c* formed to encircle an outer peripheral surface 25*b* of the frame member 25.

When the workpiece W is pressurized, the pressurizing pad 26 is deformed to conform to the shape of the surface of the workpiece W and uniformly pressurizes the workpiece W, and also defines the accommodating chamber 20R. The pressurizing pad 26 is held by the lower end portion 25*a* of the frame member 25 and is disposed below the upper mold 24. The pressurizing pad 26 includes a flexible layer 26*a* and a heat insulation layer 26*b*.

The flexible layer 26*a* uniformly transmits the pressure from the upper mold 24 to the workpiece W when the workpiece W is pressurized. The flexible layer 26*a* is made of an elastic material having a known high fluidity and low rebound elasticity, for example. The flexible layer 26*a* is filled between two film members (not illustrated, the same applies below) disposed above and below the flexible layer 26*a*. The outer edge portion of the film member is held by the lower end portion 25*a* of the frame member 25 over the entire perimeter, thereby surrounding the flexible layer 26*a* with the lower end portion 25*a* of the frame member 25 in the horizontal direction.

The heat insulation layer 26*b* uniformly transmits the pressure from the upper mold 24 to the workpiece W when the workpiece W is pressurized, and also eliminates heat transfer from the heating unit 61 to the flexible layer 26*a*. The heat insulation layer 26*b* is made of a known fiber material having high flexibility and low thermal conductivity, for example. The heat insulation layer 26*b* is disposed below the flexible layer 26*a* and adjacent to the flexible layer 26*a*. The heat insulation layer 26*b* is filled between two film members (not illustrated, the same applies below) disposed above and below the heat insulation layer 26*b*. The outer edge portion of the film member is held by the lower end portion 25*a* of the frame member 25 over the entire perimeter, thereby surrounding the heat insulation layer 26*b* with the lower end portion 25*a* of the frame member 25 in the horizontal direction.

Note that, in the present invention, when the temperature of main heating described later is lower than a heat-resistant temperature of the flexible layer 26*a*, the pressurizing pad 26 need not include the heat insulation layer 26*b*.

The side member 27 defines the accommodating chamber 20R. The side member 27 is made of metal (e.g., stainless steel) having high rigidity, for example. When viewed from below, the side member 27 has a rectangular shape along the XY-axis direction and has a frame shape. That is, when viewed from below, a rectangular internal space is defined at the center of the side member 27. In the horizontal direction, the side member 27 is disposed to surround the frame member 25. That is, the frame member 25 (the upper mold 24, the pressurizing pad 26) is disposed in the internal space. The side member 27 is supported by the base member 23 to allow relative vertical movement with respect to the upper mold 24 and the frame member 25 via the second spring members 29. The side member 27 includes a groove portion 27*b* formed on a lower surface 27*a* of the side member 27 and a through hole 27*c* opening on an inner surface and an outer surface of the side member 27. The through hole 27*c* is an example of a communication path in the present invention.

The first spring members 28 support the frame member 25 to allow relative vertical movement with respect to the upper mold 24. The first spring members 28 are disposed between the base member 23 and the frame member 25 and are attached to the lower surface 23*a* of the base member 23 and an upper surface 25*d* of the frame member 25.

The second spring members 29 support the side member 27 to allow relative vertical movement with respect to the upper mold 24 and the frame member 25. The second spring members 29 are disposed between the base member 23 and the side member 27 and are attached to the lower surface 23*a* of the base member 23 and an upper surface 27*d* of the side member 27.

The sealing members 30 and 31 air-tightly seal between the frame member 25 and the side member 27 and between the placement table 21 and the side member 27, respectively. The sealing members 30 and 31 are known O-rings, for example. The sealing member 30 is disposed in the groove portion 25*c* and abuts on the frame member 25 and the side member 27. The sealing member 31 is disposed in the groove portion 27*b* and abuts on the placement table 21 and the side member 27.

The movable connector Cp is a joint for the line connected to the fixed connectors Cs1 to Cs5. The movable connector Cp is a known check valve coupling plug, for example. The movable connector Cp is attached to an outer surface of the side member 27, for example, in such a way as to communicate with the through hole 27*c*. The movable connector Cp is configured to be attachable to and detachable from the fixed connectors Cs1 to Cs5. The check valve of the movable connector Cp is configured to close even under the depressurized atmosphere in the accommodating chamber 20R when the connection with the fixed connectors Cs1 to Cs5 is released.

The accommodating chamber 20R is a space for accommodating the workpiece W formed in the chamber unit 20. The accommodating chamber 20R is a sealed space defined by the placement table 21, the frame member 25, the pressurizing pad 26, the side member 27, and the sealing members 30 and 31. The accommodating chamber 20R communicates with the movable connector Cp via the through hole 27*c*. The placement table 21 functions as a floor portion that defines the accommodating chamber 20R, the pressurizing pad 26 functions as a ceiling portion that defines the accommodating chamber 20R, and the side member 27 functions as a peripheral wall portion that defines the accommodating chamber 20R. That is, the placement table 21 is an example of the floor portion in the present invention, the pressurizing pad 26 is an example of the ceiling portion in the present invention, and the side member 27 is an example of the peripheral wall portion in the present invention.

The chamber unit 20 configured in this way is conveyed through the execution areas A21 to A25 by the conveying device 9. In this case, an outer peripheral edge portion of the base member 23 is placed on the rail members R1 to R16, and the roller Ro abuts on an outer peripheral surface 23*b* of the base member 23. The roller Ro rotates, thereby causing the base member 23 to slide on the rail members R1 to R16, and the chamber unit 20 is conveyed. As described above, the base members B1 to B8 are attached to the ceiling of the housing 2, and thus the chamber unit 20 passes through the upper space in the execution areas A21 to A25 and is conveyed (moved) through the execution areas A21 to A25.

Operation of Pressurization System

Next, operations of the present system 1 will be described below, using an example of conveying one workpiece W. In the following description, FIGS. 1 to 5 will be referred to as appropriate.

Figure 6:
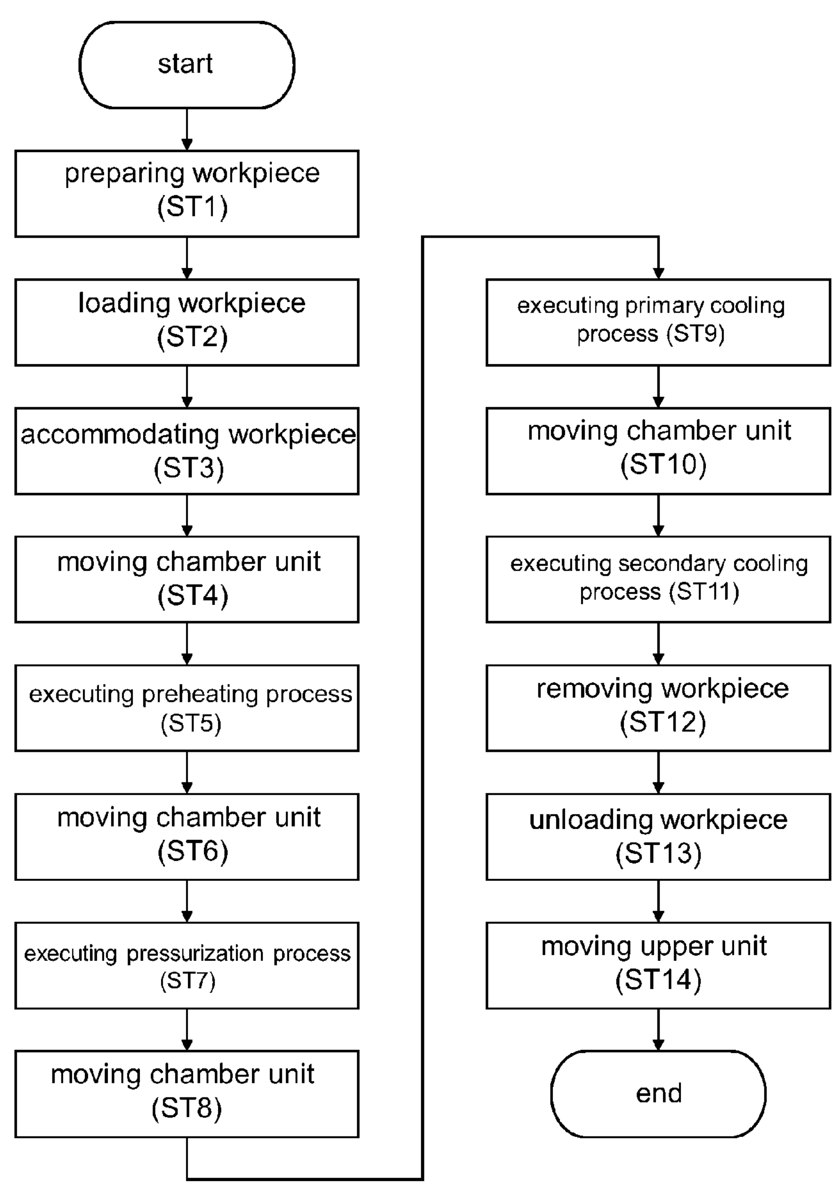
FIG. 6 is a flowchart illustrating an example of operations of the pressurization system in FIG. 1

FIG. 6 is a flowchart illustrating an example of the operations of the present system 1. The figure illustrates the operation of the present system 1 with respect to one workpiece W.

First, a workpiece W is prepared (ST1). The workpiece W is placed on the corresponding placement table 21 by a device such as a robot arm or by a user of the present system 1, for example. The plurality of placement tables 21 is accommodated in a container (not illustrated, the same applies below) such as a cassette, for example, and one placement table 21 is conveyed from the container to the loading device 11. In this case, the workpiece W is covered with an anti-adhesive sheet (not illustrated, the same applies below). The anti-adhesive sheet is a sheet that prevents the workpiece W from sticking to the pressurizing pad 26 after the heating process. The anti-adhesive sheet is a sheet made of synthetic resin, e.g., polytetrafluoroethylene (PTFE) having heat resistance to the temperature of the main heating described later, for example.

Figure 7:
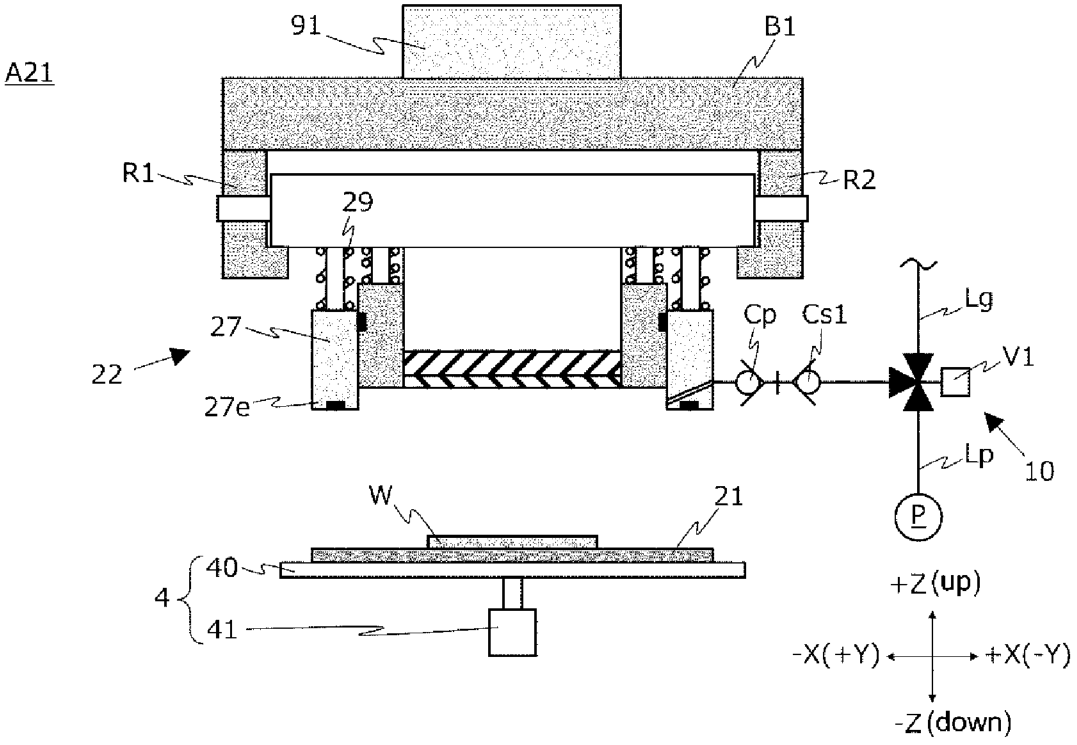
FIG. 7 is a schematic sectional view of the devices illustrating a state in which a placement table included in the pressurization system in FIG. 1 is loaded onto an accommodating device included in the pressurization system.

FIG. 7 is a schematic sectional view of the devices illustrating a state in which the placement table 21 is loaded onto the accommodating device 4. The figure illustrates a schematic section of each device in the execution area A21 when viewed along a direction where the rail members R1 and R2 are directed. The figure also illustrates a part of the atmosphere adjustment device 10. The same applies in FIGS. 8 and 9 described later.

Then, the control device 3 controls the operation of the loading device 11 and causes the placement table 21 on which the workpiece W is placed to be loaded from the loading area A1 to the execution area A21 (ST2). Specifically, the loading device 11 loads the placement table 21 on which the workpiece W is placed onto the table 40. In this case, the placement table 21 functions as a conveyor pallet that conveys (loads) the workpiece W to the execution area A21. The upper unit 22 is supported by the rail members R1 and R2 directed in the X-axis direction and is disposed above the placement table 21 (the table 40). The movable connector Cp is connected to the fixed connector Cs1. In the vertical direction, a lower end portion 27*e* of the side member 27 is located below the pressurizing pad 26 by the elastic force of the second spring members 29.

Figure 8:
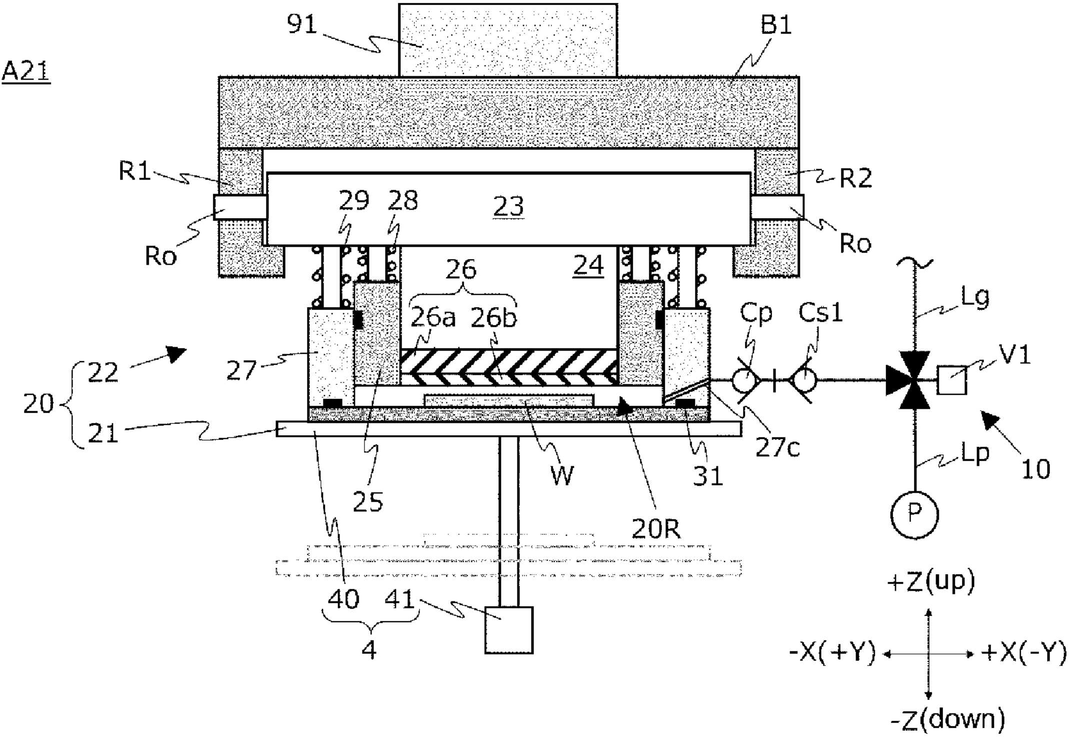
FIG. 8 is a schematic sectional view of the devices illustrating a state in which the placement table in FIG. 7 abuts on an upper unit included in the chamber unit in FIG. 5.
Figure 9:
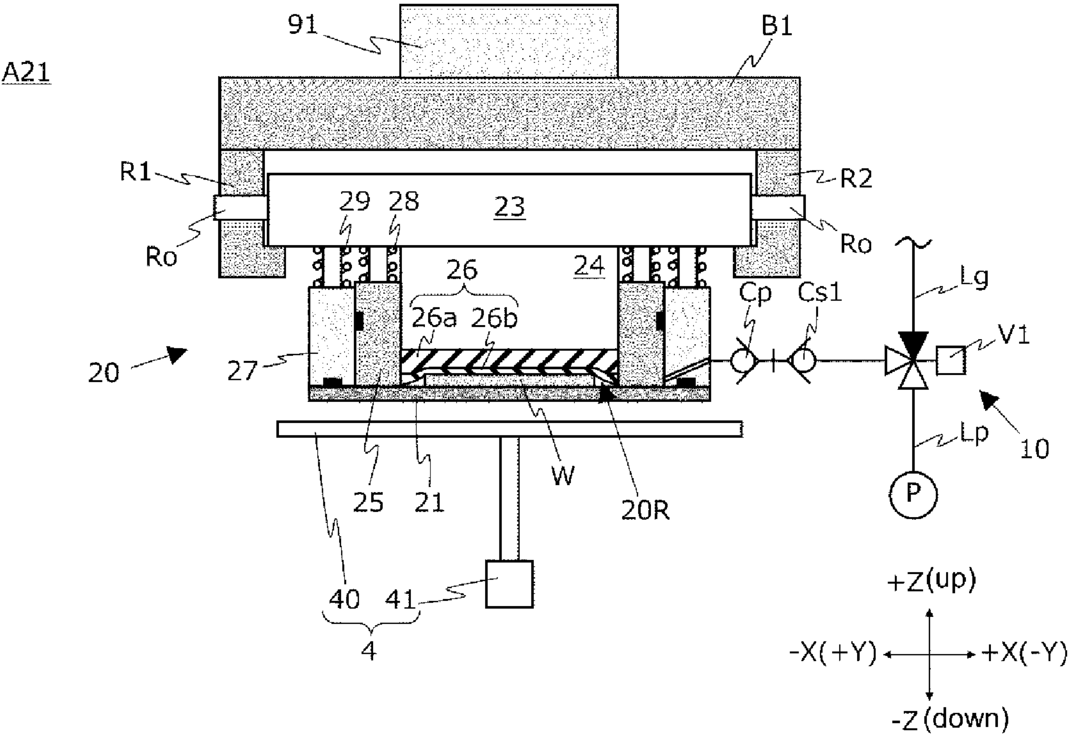
FIG. 9 is a schematic sectional view of the devices illustrating a state in which a workpiece is accommodated in the chamber unit in FIG. 5.

FIG. 8 is a schematic sectional view of the devices illustrating a state in which the placement table 21 abuts on the upper unit 22. FIG. 9 is a schematic sectional view of the devices illustrating a state in which the workpiece W is accommodated in the chamber unit 20.

Then, the control device 3 controls the operations of the accommodating device 4 and the atmosphere adjustment device 10 and accommodates the workpiece W in the chamber unit 20 (ST3). That is, the accommodation process is executed.

The "accommodation process" is a process in which the chamber unit 20 is assembled and the workpiece W is accommodated in the chamber unit 20. The pressurization process is executed for the workpiece W accommodated in the chamber unit 20, and thus the accommodating process is a process for preparing the pressurization process, i.e., preprocessing for the pressurization process.

Specifically, the raising and lowering device 41 raises the table 40 until the placement table 21 on which the workpiece W is placed comes into full contact with the upper unit 22 (the sealing member 31). In this case, an accommodating chamber 20R is defined between the placement table 21 and the upper unit 22, and the workpiece W is accommodated in the accommodating chamber 20R. Then, the atmosphere adjustment device 10 operates the vacuum pump P and the valve V1, replaces the atmosphere in the accommodating chamber 20R with inert gas, and then changes the atmosphere in the accommodating chamber 20R to the depressurized atmosphere. In this case, due to the vacuum pressure (a pressure difference between the accommodating chamber 20R and outer space of the chamber unit 20), the placement table 21 is brought into full contact with the side member 27 i.e., the placement table 21 is attached to the side member 27, and the second spring members 29 contract, thereby raising the placement table 21 and the side member 27. That is, in the vertical direction, the frame member 25 and the pressurizing pad 26 approach the placement table 21 (the workpiece W). In other words, the frame member 25 and the pressurizing pad 26 are lowered relative to the placement table 21. Finally, the pressurizing pad 26 comes into contact with the workpiece W, and the workpiece W is preliminarily pressurized by a pressing force depending on the vacuum pressure. The frame member 25 abuts on the placement table 21. Due to the pre-pressurization, the pressurizing pad 26 is deformed depending on a shape of a surface of the workpiece W, and the workpiece W is held by the placement table 21 and the pressurizing pad 26. Herein, the pressing force applied to the workpiece W in the pre-pressurization is sufficiently smaller than the pressing force applied to the workpiece W in the pressurization process. Then, the raising and lowering device 41 lowers the table 40. In this way, in the execution area A21, the placement table 21 is attached to the upper unit 22, thereby assembling the chamber unit 20 and accommodating the workpiece W in the chamber unit 20, i.e., the accommodating process is executed. When the chamber unit 20 is assembled, the placement table 21 is disposed below the workpiece W, the pressurizing pad 26 is disposed above the workpiece W, and the side member 27 is disposed in such a way as to surround the entire perimeter of the workpiece W in the horizontal direction.

Then, the control device 3 controls the operation of the conveying device 9 and moves the chamber unit 20 from the execution area A21 to the execution area A22 (ST4). Specifically, the rotation mechanism 91 rotates the base member B1 by 90 degrees in the clockwise direction when viewed from above. In this case, the orientation of the rail members R1 and R2 is changed from the X-axis direction to the Y-axis direction. That is, the moving direction of the chamber unit 20 is changed from the X-axis direction to the Y-axis direction. That is, the execution area A21 also functions as the direction changing area in the present invention. Then, the rollers Ro corresponding to the rail members R1 to R4, R9, and R10 rotate, thereby conveying the chamber unit 20 to the execution area A22 via the rail members R9 and R10. In this case, the orientation of the rail members R3 and R4 is directed in the Y-axis direction. Then, the rotation mechanism 92 rotates the base member B2 by 90 degrees in the clockwise direction when viewed from above. In this case, the orientation of the rail members R3 and R4 is changed from the Y-axis direction to the X-axis direction. That is, the moving direction of the chamber unit 20 is changed from the Y-axis direction to the X-axis direction. That is, the execution area A22 also functions as the direction changing area in the present invention. Then, the rotation mechanism 91 rotates the base member B1 by 90 degrees in the counter-clockwise direction when viewed from above.

When the chamber unit 20 moves from the execution area A21, the connection between the movable connector Cp and the fixed connector Cs1 is released. In this case, the check valve of the movable connector Cp is closed, thereby sealing the accommodating chamber 20R, and the depressurized atmosphere in the accommodating chamber 20R is maintained.

Figure 10:
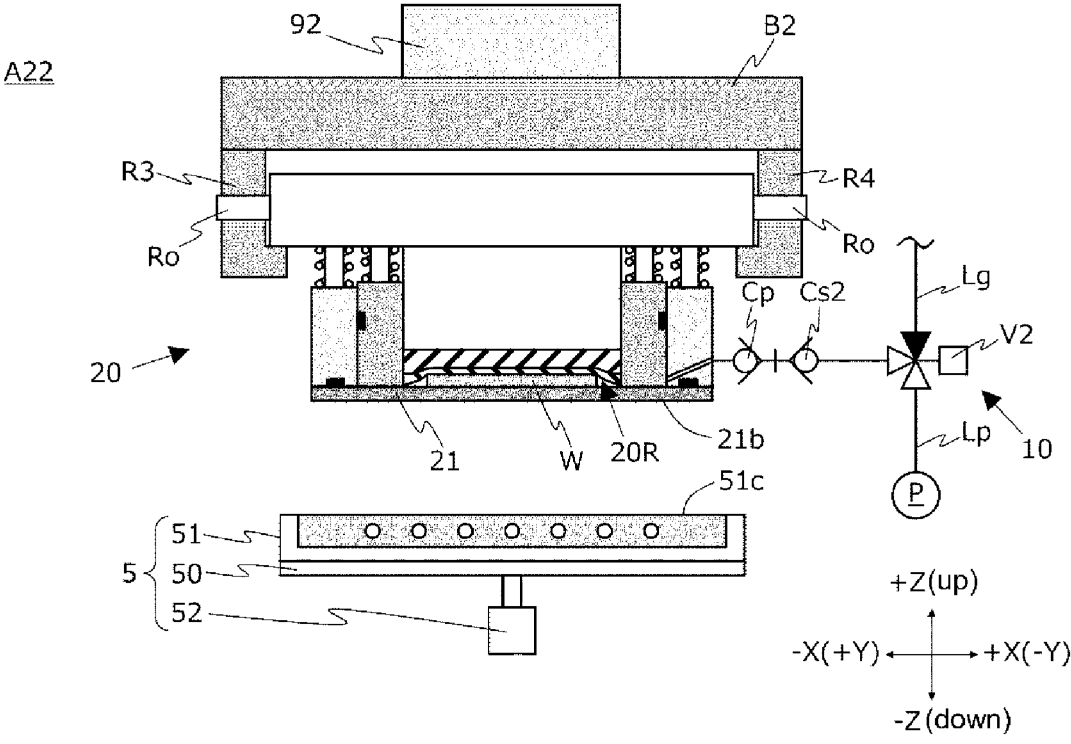
FIG. 10 is a schematic sectional view of the devices illustrating a state in which the chamber unit in FIG. 5 is conveyed to the execution area where a preheating process is executed.
Figure 11:
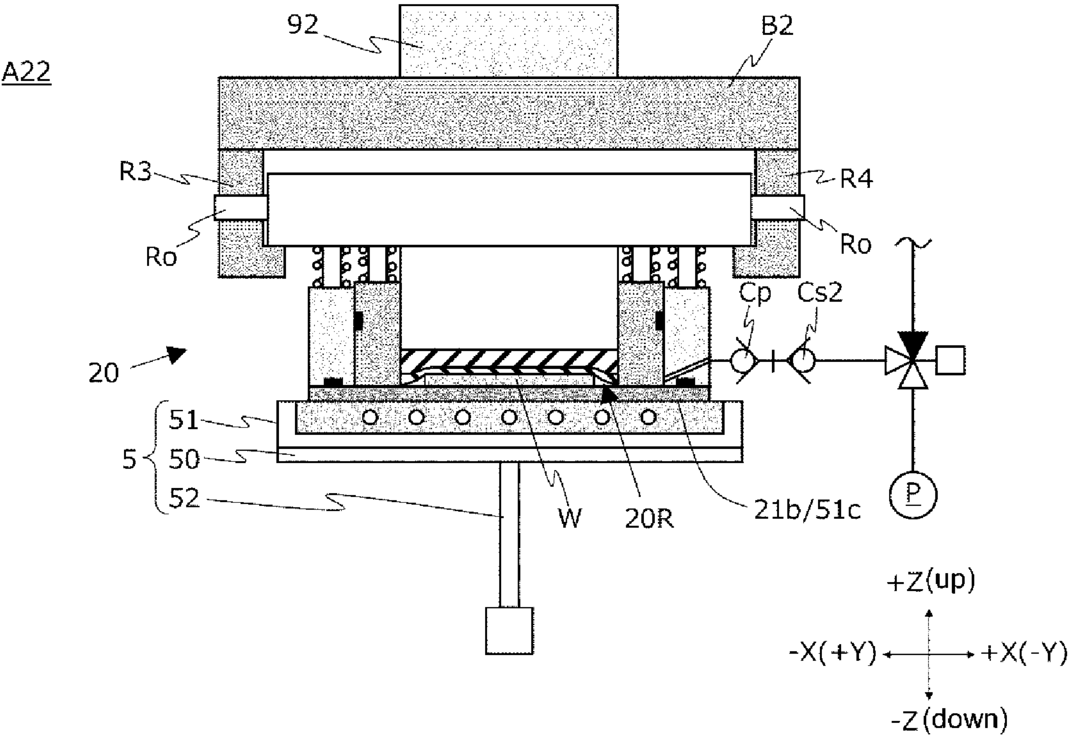
FIG. 11 is a schematic sectional view of the chamber unit in FIG. 5 for which the preheating process is executed.

FIG. 10 is a schematic sectional view of the devices illustrating a state in which the chamber unit 20 is conveyed to the execution area A22 where the preheating process is executed. FIG. 11 is a schematic sectional view of the chamber unit 20 in which the preheating process is executed. These figures illustrate a schematic section of each device in the execution area A22 when viewed along the direction in which the rail members R3 and R4 are directed. These figures also illustrate a part of the atmosphere adjustment device 10.

Then, the control device 3 controls the operation of the preheating device 5 and executes the preheating process for the workpiece W (ST5).

The "preheating process" is a process of heating the workpiece W to a predetermined preheating temperature prior to the pressurization process. The preheating process is preprocessing to be executed prior to the pressurization process in order to shorten the heating time of the workpiece W in the pressurization process. The preheating temperature is a temperature, e.g., about 200° C., lower than the main heating temperature described later.

Specifically, the raising and lowering device 52 raises the table 50 and the preheating unit 51 until the upper surface 51*c* of the preheating unit 51 abuts on the chamber unit 20 (the lower surface 21*b* of the placement table 21). Then, the raising and lowering device 52 maintains a state where the preheating unit 51 abuts on the placement table 21 for a predetermined time. Herein, the preheating unit 51 is heated to a predetermined preheating temperature in advance. Thus, the heat from the preheating unit 51 is transmitted to the workpiece W via the placement table 21. After the predetermined time has elapsed, the raising and lowering device 52 lowers the table 50 and ends the preheating process.

Herein, when the chamber unit 20 is located in the execution area A22, the movable connector Cp is connected to the fixed connector Cs2. The atmosphere adjustment device 10 operates the vacuum pump P and the valve V2 and maintains the atmosphere in the accommodating chamber 20R to the depressurized atmosphere in the execution area A22.

Then, the control device 3 controls the operation of the conveying device 9 and moves the chamber unit 20 from the execution area A22 to the execution area A23 (ST6). Specifically, the roller Ro corresponding to the rail members R3, R4, R11, and R12 rotates, thereby conveying the chamber unit 20 to the execute area A23. Then, the rotation mechanism 92 rotates the base member B2 by 90 degrees in the counterclockwise direction when viewed from above.

When the chamber unit 20 moves from the execution area A22, the connection between the movable connector Cp and the fixed connector Cs2 is released. In this case, the check valve of the movable connector Cp is closed, thereby sealing the accommodating chamber 20R, and the depressurized atmosphere in the accommodating chamber 20R is maintained.

Figure 12:
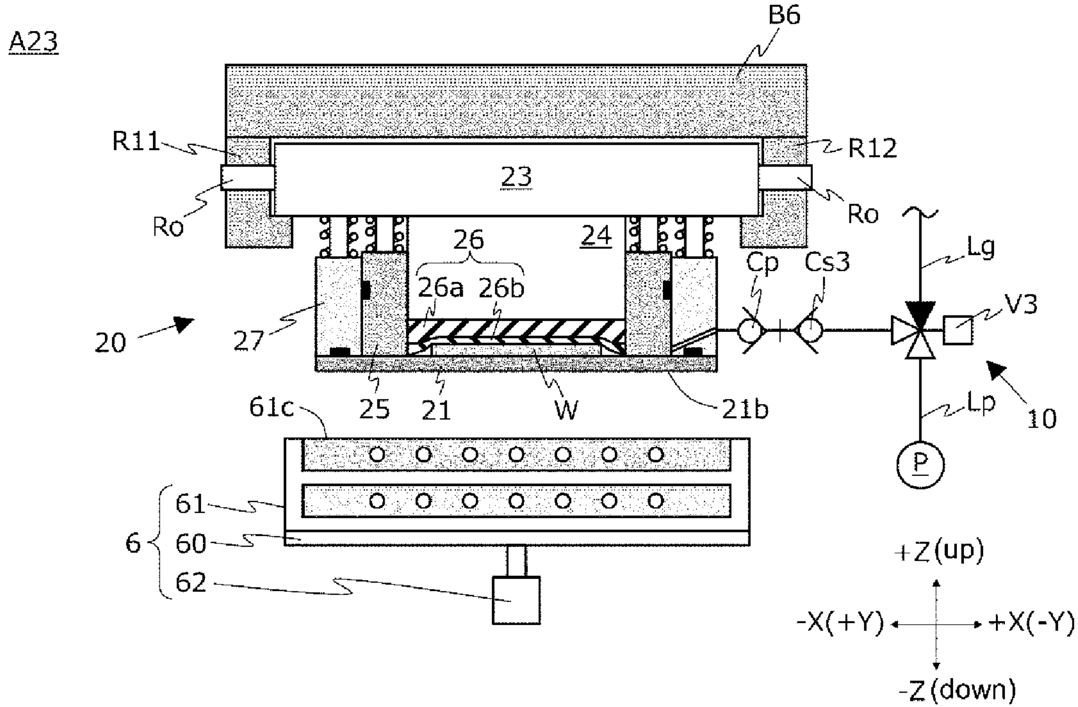
FIG. 12 is a schematic sectional view of the devices illustrating a state in which the chamber unit in FIG. 5 is conveyed to the execution area where the pressurization process is executed.
Figure 13:
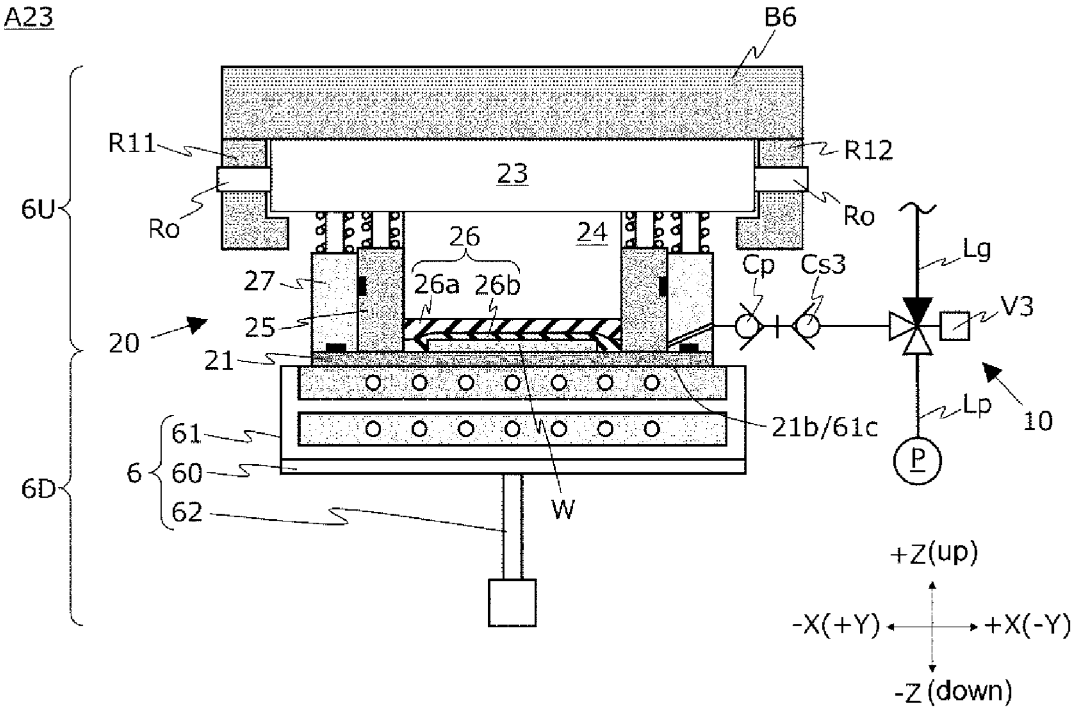
FIG. 13 is a schematic sectional view of the chamber unit in FIG. 5 for which the pressurization process is executed.

FIG. 12 is a schematic sectional view of the devices illustrating in which the chamber unit 20 is conveyed to the execution area A23 where the pressurization process is executed. FIG. 13 is a schematic sectional view of the chamber unit 20 in which the pressurization process is executed. These figures illustrate a schematic section of each device in the execution area A23 when viewed along the direction in which the rail members R11 and R12 are directed. These figures also illustrate a part of the atmosphere adjustment device 10.

Then, the control device 3 controls the operation of the pressurization device 6 and executes the pressurization process for the workpiece W (ST7).

Specifically, the raising and lowering device 62 raises the lower base member 60 and the heating unit 61 until the upper surface 61*c* of the heating unit 61 abuts on the chamber unit 20 (the lower surface 21*b* of the placement table 21). Then, the raising and lowering device 62 raises the lower base member 60 and the heating unit 61 until a predetermined pressing force (hereinafter referred to as "main pressing force") is applied to the workpiece W. In this case, the placement table 21 is raised together with the frame member 25 and the side member 27, and the upper mold 24 is lowered relative to the frame member 25 and the side member 27. Thus, the upper mold 24 pressurizes the pressurizing pad 26 downward, and the pressurizing pad 26 is deformed to conform to the shape of the surface of the workpiece W and uniformly pressurizes the workpiece W. As a result, the workpiece W is pressurized by the placement table 21 from below and is pressurized by the pressurizing pad 26 (the upper mold 24) from above.

When the workpiece W is pressurized, the base member 23 is raised from the rail members R11 and R12 by the raising and lowering device 62 and abuts on the base member B6. That is, the base member B6 restricts the upward movement of the chamber unit 20, and the chamber unit 20 is subjected to pinching pressure by the heating unit 61 and the base member B6. In this case, the base member B6 and the lower base member 60 function as a so-called bolster that is subjected to the main pressing force by the raising and lowering device 62. As a result, the main pressing force is applied to the workpiece W and the main pressing force applied to the workpiece W is stable. In this way, instead of the base member 23 alone, the two base members 23 and B6 are subjected to the main pressing force in the pressurization process, thereby achieving the design that enables the thickness of the base member 23 to be thinner than the case where the base member 23 alone is subjected to the main pressing force. Thus, the weight of the chamber unit 20 and the upper unit 22 can be reduced, and the power required for conveying these units is eliminated. The main pressing force is not applied to the rail members R11 and R12, and thus the load based on the main pressing force is not applied to the rail members R11 and R12.

Then, the raising and lowering device 62 maintains a state where the main pressing force is applied to the workpiece W for a predetermined time. Herein, an upper half portion of the heating unit 61 is heated in advance to a predetermined heating temperature (hereinafter referred to as "main pressurizing temperature", for example, about 300° C.). Thus, the heat from the heating unit 61 is transmitted to the workpiece W via the placement table 21. In this case, the heat from the heating unit 61 is also transmitted to the pressurizing pad 26 via the frame member 25 and the workpiece W. As described above, the heat insulation layer 26*b* is disposed below the flexible layer 26*a*, and thus the heat from the heating unit 61 is hardly transmitted to the flexible layer 26*a* due to the heat insulation layer 26*b*. That is, the flexible layer 26*a* is thermally protected by the heat insulation layer 26*b*. After the predetermined time has elapsed, the raising and lowering device 62 lowers the lower base member 60 and the heating unit 61 and ends the pressurization process. In this case, the chamber unit 20 is supported by the rail members R11 and R12.

Herein, when the chamber unit 20 is located in the execution area A23, the movable connector Cp is connected to the fixed connector Cs3. The atmosphere adjustment device 10 operates the vacuum pump P and the valve V3 and maintains the atmosphere in the accommodating chamber 20R to the depressurized atmosphere in the execution area A23. Thus, the workpiece W during the pressurization process is not exposed to the outside air and is not oxidized.

In this way, in the pressurization process, the base member 23, the upper mold 24, and the pressurizing pad 26 in the chamber unit 20 function as the upper pressurizing unit 6U that pressurizes the workpiece W from above together with the base member B6. In the chamber unit 20, the placement table 21 functions as the lower pressurizing unit 6D that pressurizes the workpiece W from below together with the lower base member 60 and the heating unit 61.

Then, the control device 3 controls the operation of the conveying device 9 and moves the chamber unit 20 from the execution area A23 to the execution area A24 (ST8). Specifically, the roller Ro corresponding to the rail members R5, R6, R11, and R12 rotates, thereby conveying the chamber unit 20 to the execute area A24. In this case, the orientation of the rail members R5 and R6 is directed in the X-axis direction. Then, the rotation mechanism 93 rotates the base member B3 by 90 degrees in the clockwise direction when viewed from above. In this case, the orientation of the rail members R5 and R6 is changed from the X-axis direction to the Y-axis direction. That is, the moving direction of the chamber unit 20 is changed from the X-axis direction to the Y-axis direction. That is, the execution area A24 also functions as the direction changing area in the present invention.

When the chamber unit 20 moves from the execution area A23, the connection between the movable connector Cp and the fixed connector Cs3 is released. In this case, the check valve of the movable connector Cp is closed, thereby sealing the accommodating chamber 20R, and the depressurized atmosphere in the accommodating chamber 20R is maintained.

Figure 14:
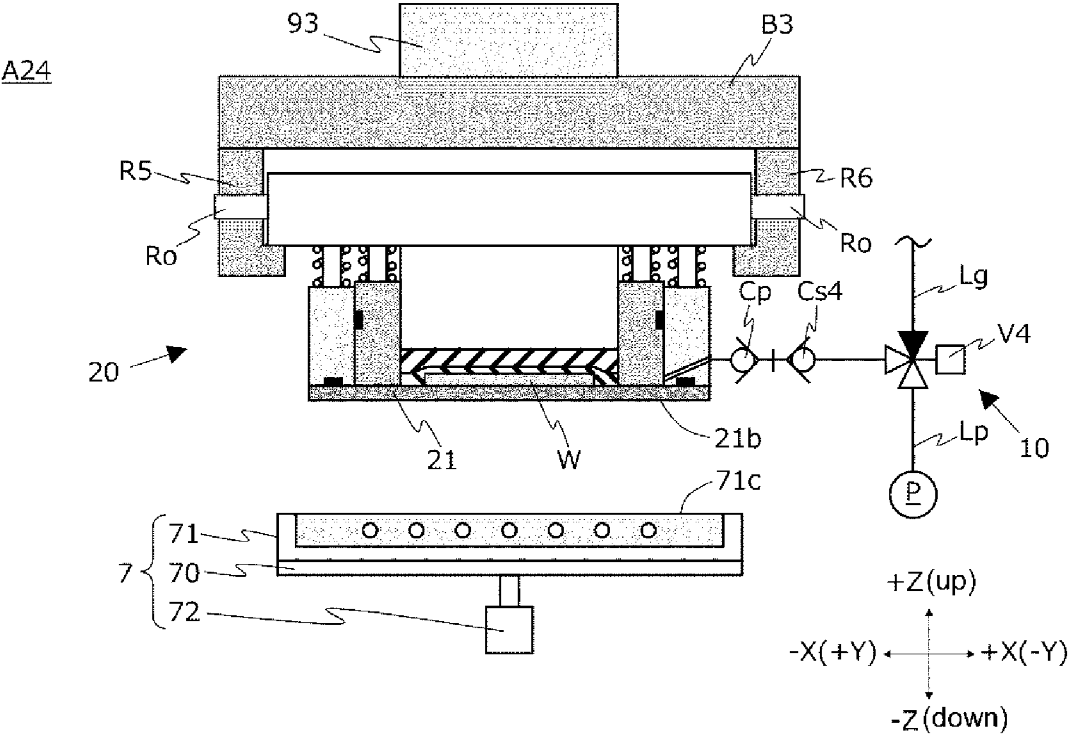
FIG. 14 is a schematic sectional view of the devices illustrating a state in which the chamber unit in FIG. 5 is conveyed to the execution area where primary cooling process is executed.
Figure 15:
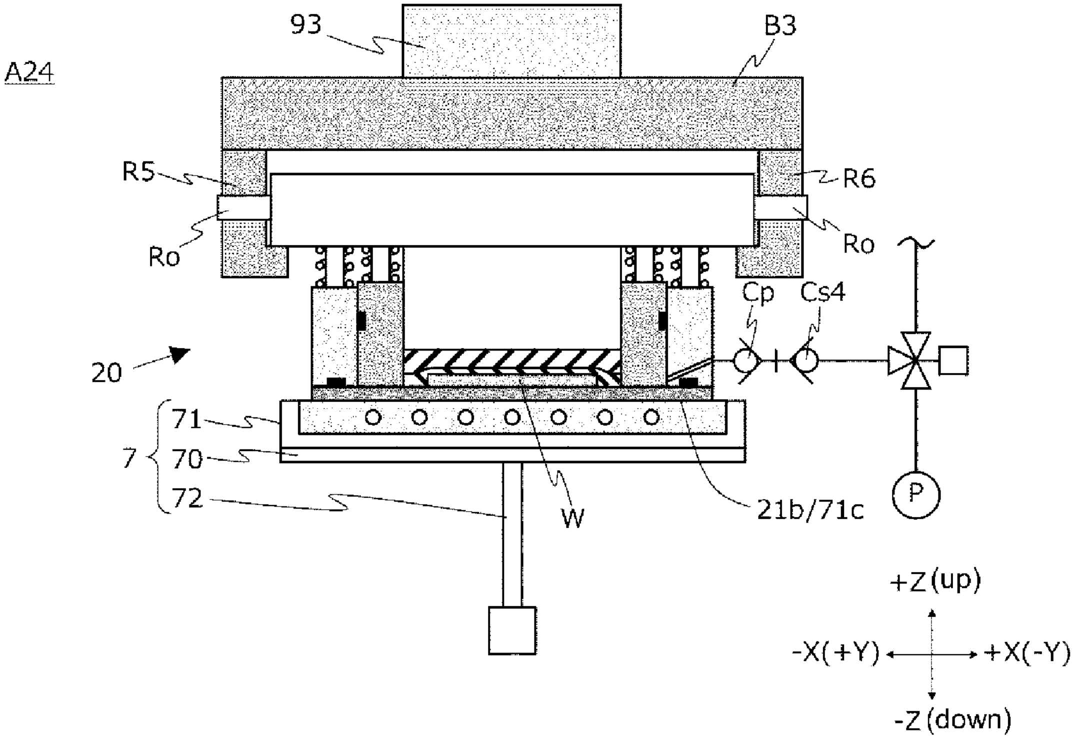
FIG. 15 is a schematic sectional view of the chamber unit in FIG. 5 for which the primary cooling process is executed.

FIG. 14 is a schematic sectional view of the devices illustrating a state in which the chamber unit 20 is conveyed to the execution area A24 where the primary cooling process is executed. FIG. 15 is a schematic sectional view of the chamber unit 20 in which the primary cooling process is executed. These figures illustrate a schematic section of each device in the execution area A24 when viewed along the direction in which the rail members R5 and R6 are directed. The figure also illustrates a part of the atmosphere adjustment device 10.

Then, the control device 3 controls the operation of the primary cooling device 7 and executes the primary cooling process for the workpiece W after the pressurization process (ST9).

The "primary cooling process" is a process for cooling the workpiece W after the pressurization process to a predetermined temperature, e.g., about 100° C. The primary cooling process is post-processing of the pressurization process to be executed after the heating process in order to cool the workpiece W after the pressurization process. In the pressurization process, not only the workpiece W but also the chamber unit 20 (the placement table 21, the frame member 25, and the side member 27) is heated. The heat capacities thereof are relatively large, and thus it takes time to cool the workpiece W. In particular, the rate at which the temperature decreases slows down once the temperature reaches a predetermined degree, e.g., about 100° C. Thus, in the present system 1, the cooling process of the workpiece W is executed in two stages, which are the primary cooling process and the secondary cooling process, with a predetermined temperature as a reference, in order to shorten the cooling time.

Specifically, the raising and lowering device 72 raises the table 70 and the primary cooling unit 71 until the upper surface 71*c* of the primary cooling unit 71 abuts on the chamber unit 20 (the lower surface 21*b* of the placement table 21). Then, the raising and lowering device 72 maintains a state where the primary cooling unit 71 abuts on the placement table 21 for a predetermined time. Herein, the primary cooling unit 71 is cooled to a predetermined primary cooling temperature, e.g., about 20° C., in advance. Thus, the workpiece W is cooled to approximately a predetermined temperature, e.g., about 100° C., by the primary cooling unit 71 via the placement table 21. After the predetermined time has elapsed, the raising and lowering device 72 lowers the table 70 and ends the primary cooling process.

Herein, when the chamber unit 20 is located in the execution area A24, the movable connector Cp is connected to the fixed connector Cs4. The atmosphere adjustment device 10 operates the vacuum pump P and a valve V4 and maintains the atmosphere in the accommodating chamber 20R to the depressurized atmosphere during the primary cooling process. Thus, the workpiece W during the primary cooling process is not exposed to the outside air and is not oxidized.

Then, the control device 3 controls the operation of the conveying device 9 and moves the chamber unit 20 from the execution area A24 to the execution area A25 (ST10). Specifically, the roller Ro corresponding to the rail members R5 to R8, R13, and R14 rotates, thereby conveying the chamber unit 20 to the execute area A24 via the rail members R13 and R14. In this case, the orientation of the rail members R7 and R8 is directed in the Y-axis direction. Then, the rotation mechanism 94 rotates the base member B4 by 90 degrees in the clockwise direction when viewed from above. In this case, the orientation of the rail members R7 and R8 is changed from the Y-axis direction to the X-axis direction. That is, the moving direction of the chamber unit 20 is changed from the Y-axis direction to the X-axis direction. That is, the execution area A25 also functions as the direction changing area in the present invention. Then, the rotation mechanism 93 rotates the base member B3 by 90 degrees in the counterclockwise direction when viewed from above.

When the chamber unit 20 moves from the execution area A24, the connection between the movable connector Cp and the fixed connector Cs4 is released. In this case, the check valve of the movable connector Cp is closed, thereby sealing the accommodating chamber 20R, and the depressurized atmosphere in the accommodating chamber 20R is maintained.

Figure 16:
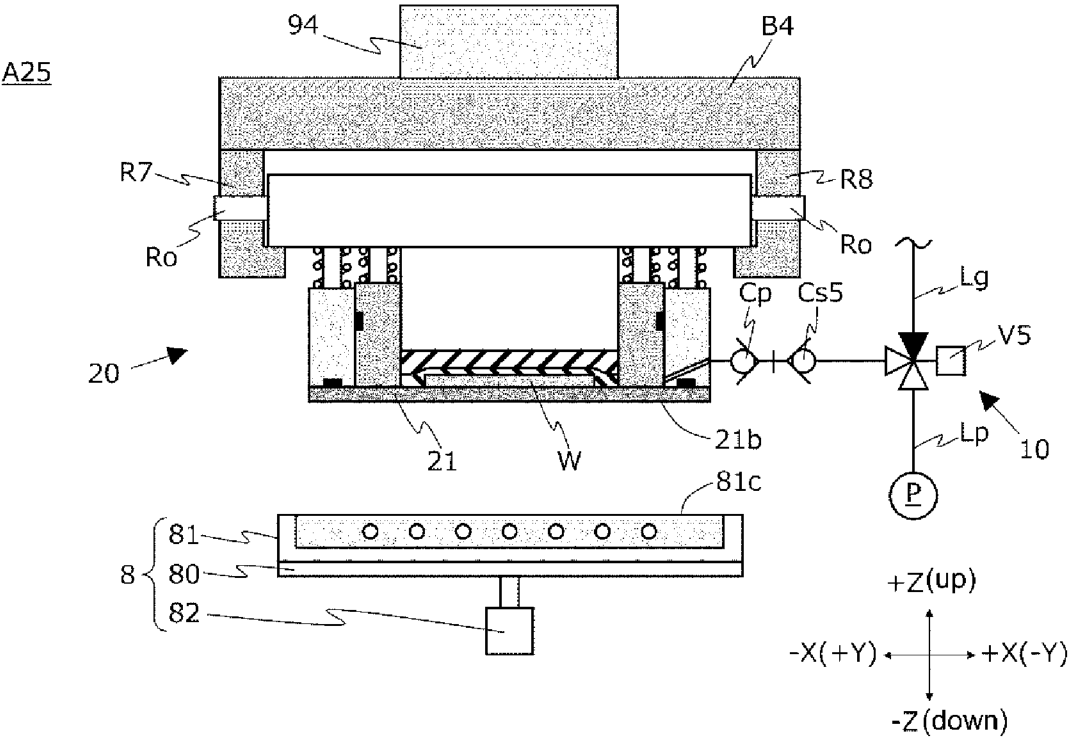
FIG. 16 is a schematic sectional view of the devices illustrating a state in which the chamber unit in FIG. 5 is conveyed to the execution area where a secondary cooling process is executed.
Figure 17:
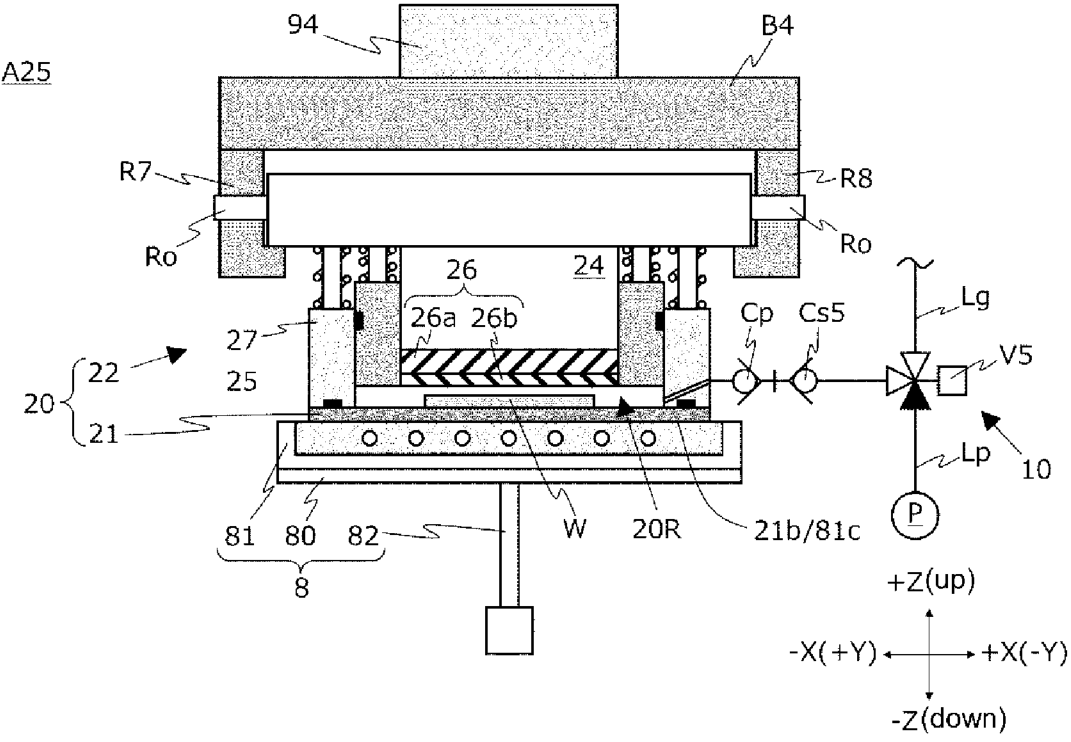
FIG. 17 is a schematic sectional view of the chamber unit in FIG. 5 after ending the secondary cooling process.

FIG. 16 is a schematic sectional view of the devices illustrating a state in which the chamber unit 20 is conveyed to the execution area A25 where the secondary cooling process is executed. FIG. 17 is a schematic sectional view of the chamber unit 20 after ending the secondary cooling process. These figures illustrate a schematic section of each device in the execution area A25 when viewed along the direction in which the rail members R7 and R8 are directed. The figures also illustrate a part of the atmosphere adjustment device 10. The same applies in FIG. 18 described later.

Then, the control device 3 controls the operations of the removal device 8 and the atmosphere adjustment device 10, executes the secondary cooling process for the workpiece W (ST11), and then executes the removal process of the workpiece W.

The "secondary cooling process" is a process for cooling the workpiece W after the primary cooling process to a temperature at which the workpiece W can be removed, e.g., about 60° C. or less. The secondary cooling process is post-processing of the pressurization process to be executed after the heating process in order to cool the workpiece W after the pressurization process together with the primary cooling process.

The "removal process" is a process in which the assembly of the chamber unit 20 is released, i.e., the placement table 21 is removed from the upper unit 22, and the workpiece W is removed from the chamber unit 20. The workpiece W is removed from the chamber unit 20 and a series of processing for the workpiece W is completed, and thus the removal process is post-processing for the pressurization process.

Specifically, the raising and lowering device 82 raises the table 80 and the secondary cooling unit 81 until the upper surface 81*c* of the secondary cooling unit 81 abuts on the chamber unit 20 (the lower surface 21*b* of the placement table 21). Then, the raising and lowering device 82 maintains a state where the secondary cooling unit 81 abuts on the placement table 21 for a predetermined time. Herein, the secondary cooling unit 81 is cooled to a predetermined secondary cooling temperature, e.g., about 20° C., in advance. Thus, the workpiece W is cooled to a predetermined temperature, e.g., about 60° C. or less, by the secondary cooling unit 81 via the placement table 21. After the predetermined time elapses, the secondary cooling process ends.

Herein, when the chamber unit 20 is located in the execution area A25, the movable connector Cp is connected to the fixed connector Cs5. The atmosphere adjustment device 10 operates the vacuum pump P and a valve V5 and maintains the atmosphere in the accommodating chamber 20R to the depressurized atmosphere in the execution area A25. Thus, the workpiece W during the secondary cooling process is not exposed to the outside air and is not oxidized.

Figure 18:
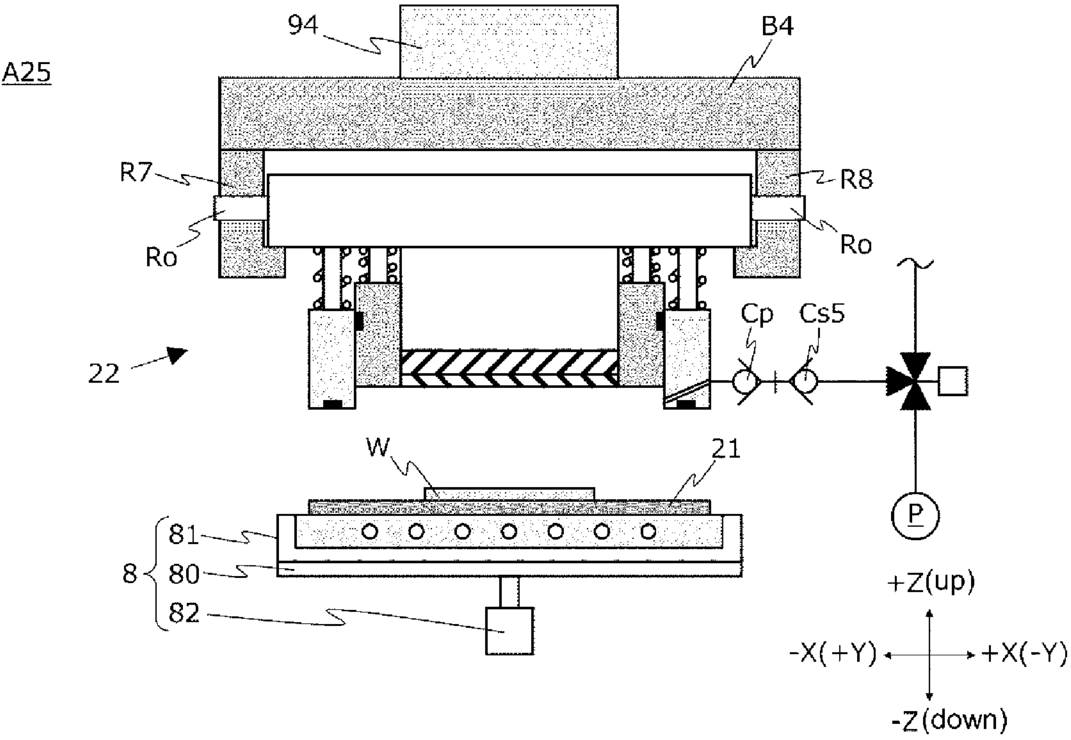
FIG. 18 is a schematic sectional view of the devices illustrating a state in which the placement table in FIG. 8 is removed from the upper unit in FIG. 8.

FIG. 18 is a schematic sectional view of the devices illustrating a state in which the placement table 21 is removed from the upper unit 22.

Then, the atmosphere adjustment device 10 operates the vacuum pump P and the valve V5, purges the atmosphere in the accommodating chamber 20R with the inert gas, and sets the atmosphere in the accommodating chamber 20R to the inert gas atmosphere (the atmospheric pressure). In this case, the vacuum pressure disappears, the second spring members 29 extend, and the placement table 21 and the side member 27 are lowered. That is, in the vertical direction, the frame member 25 and the pressurizing pad 26 move away from the placement table 21. In other words, the frame member 25 and the pressurizing pad 26 are raised relative to the placement table 21. The placement table 21 can be removed from the upper unit 22. Then, the raising and lowering device 82 lowers the table 80 and the secondary cooling unit 81, removes the placement table 21 from the upper unit 22, and also removes the workpiece W from the chamber unit 20 (ST12). In this way, in the execution area A25, the placement table 21 is removed from the upper unit 22, thereby releasing the assembly of the chamber unit 20, and the workpiece W is removed from the chamber unit 20, i.e., the removal process is executed.

Note that, in the present invention, the purging of the accommodating chamber 20R may be executed by using air.

Then, the control device 3 controls the operation of the unloading device 12 and causes the placement table 21 on which the workpiece W after the secondary cooling process is placed to be unloaded from the execution area A25 to the unloading area A3 (ST13). Specifically, the unloading device 12 unloads the placement table 21 on which the workpiece W is placed from the top of the secondary cooling unit 81 to the unloading position of the unloading area A3. That is, the placement table 21 functions as a conveyor pallet that conveys (unloads) the workpiece W after the pressurization from the execution area A25 to the unloading area A3.

Then, the control device 3 controls the operation of the conveying device 9, moves the upper unit 22 (in other words, the chamber unit 20 from which the placement table 21 is removed) from the execution area A25 to the execution area A26, and then moves the upper unit 22 from the execution area A26 to the execution area A21 (ST14). Specifically, the roller Ro corresponding to the rail members R7, R8, R15, and R16 rotates, thereby conveying the upper unit 22 to the execution area A26. Then, the rotation mechanism 94 rotates the base member B4 by 90 degrees in the counterclockwise direction when viewed from above.

Figure 19:
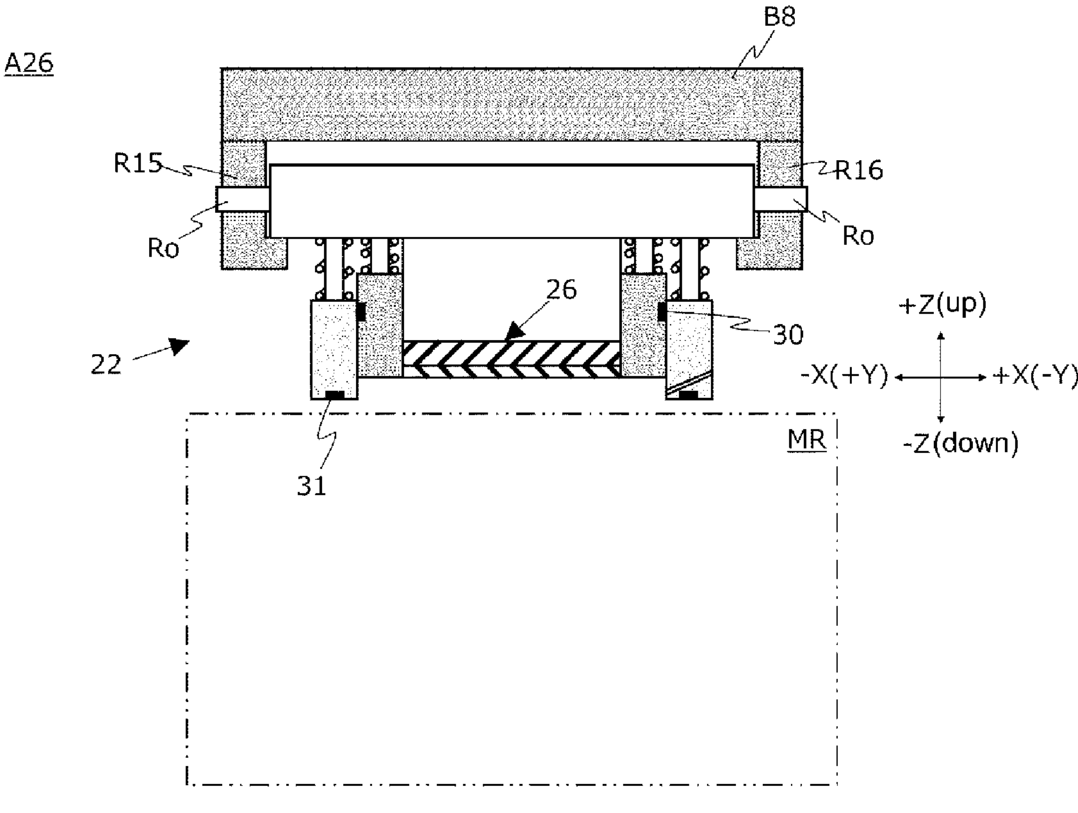
FIG. 19 is a schematic sectional view of the devices illustrating a state in which the upper unit in FIG. 18 is conveyed to the execution area where a maintenance process can be executed.

FIG. 19 is a schematic sectional view of the devices illustrating a state in which the upper unit 22 is conveyed to the execution area A26 where the maintenance process can be executed. The figure illustrates a schematic sectional view of each device in the execution area A26 when viewed along the direction in which the rail members R15 and R16 are directed.

The "maintenance process" is a process in which maintenance, e.g., checking the conditions of the pressurizing pad 26 and the sealing members 30 and 31, replacement of the pressurizing pad 26, etc., of the upper unit 22 (in other words, the chamber unit 20 from which the placement table 21 is removed) is executed by a user of the present system 1, for example. The maintenance process is not directly related to the pressurization process, but is indirectly related to the pressurization process. Accordingly, in the present embodiment, the maintenance process is an example of the related process.

As described above, the raising and lowering devices 41, 52, 62, 72, and 82 are not disposed in the execution area A26 unlike the other execution areas A21 to A25. That is, when the upper unit 22 is located in the execution area A26, relatively wide space (hereinafter referred to as "maintenance space MR") where maintenance for the upper unit 22 can be executed is available below the upper unit 22, compared with the other execution areas A21 to A25. The user of the present system 1 executes the maintenance process for the upper unit 22 as necessary.

Note that, in the present invention, a part or all of the maintenance process may be automatically executed. That is, an imaging device that captures the upper unit 22 from below may be disposed in the execution area A26, and the condition of the pressurizing pad 26 may be automatically determined based on the image, for example. A device (a mechanism) for replacement of the pressurizing pad 26 may be disposed in the execution area A26, and the pressurizing pad 26 may be automatically replaced, for example.

Then, the roller Ro corresponding to the rail members R1, R2, R15, and R16 rotates, thereby conveying the upper unit 22 to the execute area A21. In this case, the orientation of the rail members R1 and R2 is directed in the X-axis direction.

In this way, the chamber unit 20 is conveyed through the execution areas A21 to A25 and the upper unit 22 (the chamber unit 20 from which the placement table 21 is removed) is conveyed through the execution areas A25, A26, and A21. That is, the upper unit 22 makes one round through the execution areas A21 to A26. In the execution area A21, the next placement table 21 is attached to the upper unit 22, the chamber unit 20 that accommodates the next workpiece W is assembled, and the chamber unit 20 is conveyed again through the execution areas A21 to A25. In other words, in the present system 1, the chamber unit 20 is formally (apparently) conveyed in such a way as to make a circuit through the execution areas A21 to A25 repeatedly. Then, the pressurization process and the related processes for one workpiece W are sequentially executed for each round of the chamber unit 20. In this configuration, after ending the process corresponding to one of certain execution areas A21 to A25, the chamber unit 20 is conveyed to another area in the execution areas A21 to A25 where the next process is to be executed. Thus, as described below, the same process can be executed for another chamber unit 20 in the execution areas A21 to A25 where the process has ended.

Next, the operations of the present system 1 will be described below, using an example of conveying the plurality of workpieces W, i.e., the plurality of chamber units 20. In the following description, FIGS. 1 to 18 will be referred to as appropriate.

Figures 20A, 20B, 20C, 20D, 20E, 20F:
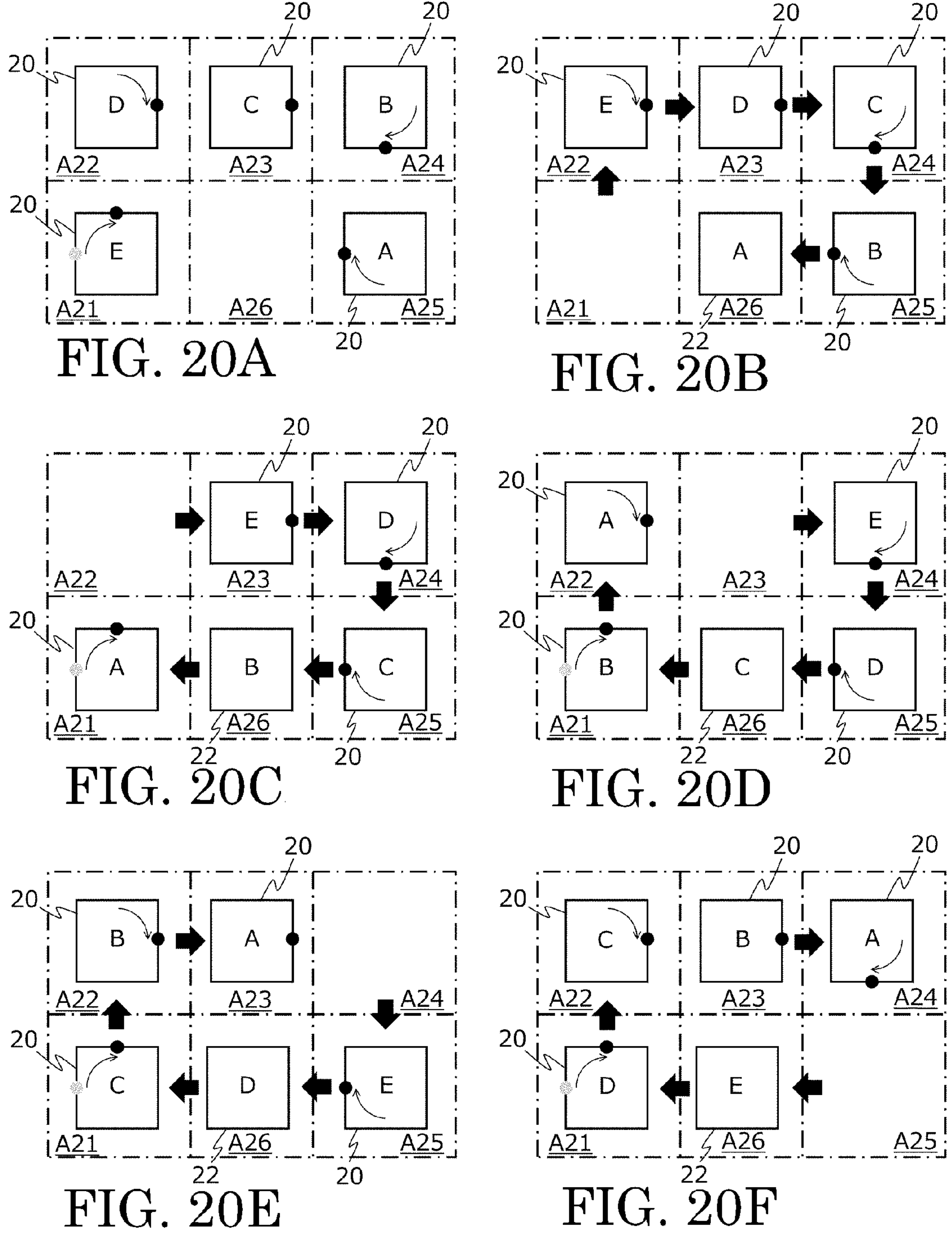
FIG. 20A illustrates a position at time "T1"
FIG. 20B illustrates a position at time "T2"
FIG. 20C illustrates a position at time "T3"
FIG. 20D illustrates a position at time "T4"
FIG. 20E illustrates a position at time "T5"
FIG. 20F illustrates a position at time "T6".

FIG. 20 is a schematic plan view of the plurality of chamber units 20 (a part of the figure is the upper unit 22) illustrating positions thereof in time series. FIG. 20A illustrates a position at time "T1", FIG. 20B illustrates a position at time "T2", FIG. 20C illustrates a position at time "T3", FIG. 20D illustrates a position at time "T4", FIG. 20E illustrates a position at time "T5", and FIG. 20F illustrates a position at time "T6".

Herein, it is assumed that the time has elapsed in the time series in the order of time "T1", "T2", "T3", "T4", "T5", and "T6". For convenience of description, the figures illustrate only the execution areas A21 to A26 (dash-dotted line) and the chamber unit 20 (solid line). The black circles in the figures illustrate the orientation of the chamber unit 20 (the upper unit 22), and the gray circles in the figures illustrate the orientation of the chamber unit 20 immediately after the accommodation process. In the figures, characters (A) to (E) are added to the chamber unit 20 and the upper unit 22 for convenience of description in order to distinguish the five chamber units 20 from one another.

At time "T1", the chamber unit 20(A) is located in the execution area A25, the chamber unit 20(B) is located in the execution area A24, the chamber unit 20(C) is located in the execution area A23, the chamber unit 20(D) is located in the execution area A22, and the chamber unit 20(E) is located in the execution area A21. Each process corresponding to each execution area is executed for each workpiece W accommodated in each chamber unit 20(A to E).

At time "T2", the upper unit 22(A) is located in the execution area A26, the chamber unit 20(B) is located in the execution area A25, the chamber unit 20(C) is located in the execution area A24, the chamber unit 20(D) is located in the execution area A23, and the chamber unit 20(E) is located in the execution area A22. Each process corresponding to each execution area is executed for each workpiece W accommodated in each chamber unit 20 (B to E). The maintenance process is executed for the upper unit 22(A).

At time "T3", the chamber unit 20(A) is located in the execution area A21, the upper unit 22(B) is located in the execution area A26, the chamber unit 20(C) is located in the execution area A25, the chamber unit 20(D) is located in the execution area A24, and the chamber unit 20(E) is located in the execution area A23. Each process corresponding to each execution area is executed for each workpiece W accommodated in each chamber unit 20(A and C to E). The maintenance process is executed for the upper unit 22(B).

At time "T4", the chamber unit 20(A) is located in the execution area A22, the chamber unit 20(B) is located in the execution area A21, the upper unit 22(C) is located in the execution area A26, the chamber unit 20(D) is located in the execution area A25, and the chamber unit 20(E) is located in the execution area A24. Each process corresponding to each execution area is executed for each workpiece W accommodated in each chamber unit 20(A, B, D, and E). The maintenance process is executed for the upper unit 22(C).

At time "T5", the chamber unit 20(A) is located in the execution area A23, the chamber unit 20(B) is located in the execution area A22, the chamber unit 20(C) is located in the execution area A21, the upper unit 22(D) is located in the execution area A26, and the chamber unit 20(E) is located in the execution area A25. Each process corresponding to each execution area is executed for each workpiece W accommodated in each chamber unit 20(A to C and E). The maintenance process is executed for the upper unit 22(D).

At time "T6", the chamber unit 20(A) is located in the execution area A24, the chamber unit 20(B) is located in the execution area A23, the chamber unit 20(C) is located in the execution area A22, the chamber unit 20(D) is located in the execution area A26, and the upper unit 22(E) is located in the execution area A26. Each process corresponding to each execution area is executed for each workpiece W accommodated in each chamber unit 20(A to D). The maintenance process is executed for the upper unit 22(E).

Herein, conveying each chamber unit 20(A to E) is executed based on the completion of the process with the longest processing time, i.e., the pressurization process in the present embodiment. That is, the conveying each chamber unit 20(A to E) is executed in such a way that the pressurization process in the execution area A23 ends when the conveying the chamber unit 20(A to E), located in the execution area A24, to the execution area A25 is completed, for example.

In the present embodiment, the execution areas A21, A22, A24, and A25 also functions as the direction changing area in the execution areas A21 to A26. In this configuration, it is not necessary to dispose the direction changing area separately from the execution areas A21 to A26, and the execution areas A21 to A26 need not be disposed in a straight line, and thus the floor area of the housing 2 can be made smaller. In the direction changing area, the orientation of the rail members R1 to R8 cannot be changed unless the chamber unit 20 or the upper unit 22 is unloaded from the direction changing area. Accordingly, the conveying device 9 cannot convey all the chamber units 20 and the upper units 22 at the same time, and the conveying device 9 conveys the chamber units 20 and the upper units 22 in sequence. Thus, the total number of the chamber unit 20 and the upper unit 22 is set to a number that is "one" or more less than the number of the execution areas A21 to A26.

Note that, in the present invention, when the execution areas A21 to A26 are configured so as not to include the direction changing area (for example, the second to the fourth modified examples described later), or when a standby area that allows the chamber unit 20 or the upper unit 22 to stand by is disposed through the execution areas A21 to A26, the total number of the chamber unit 20 and the upper unit 22 may be the same as the number of the execution areas A21 to A26.

Thus, the chamber units 20(A to E) formally makes a circuit through the execution areas A21 to A25 by moving toward the execution area A26 as the upper units 22(A to E). Accordingly, the present system 1 is able to concurrently execute different processes for the plurality of chamber units 20(A to E). As a result, in the present system 1, the time required between the pressurization process for a certain workpiece W and the pressurization process for the next workpiece W, i.e., the time between the consecutive pressurization processes, is significantly shortened compared with the time between pressurization processes in conventional pressurization devices. The present system 1 is able to execute the preprocessing and the post-processing, i.e., the related processes, of the pressurization process concurrently with the pressurization process.

The workpiece W is conveyed to the execution areas A21 to A25 in a state accommodated in the accommodating chamber 20R (the chamber unit 20) sealed in the depressurized atmosphere and is subjected to a series of processes (the preheating process, the pressurization process, the primary cooling process, and the secondary cooling process). That is, the workpiece W is not exposed to the outside air during the series of processes. Thus, oxidation of the workpiece W due to heat and the outside air is prevented at each process, and the risk of contamination of the workpiece W with foreign matters (e.g., dust, dirt, etc.) from outside the chamber unit 20 is reduced.

In the present system 1, the preheating process is executed as the preprocessing of the pressurization process. Thus, the pressurization process in the present system 1 can be executed in a shorter time than the pressurization process in a conventional pressurization device that is not able to execute the preheating process.

In the present system 1, the pressurization process and the cooling process are separated. Thus, the pressurization process in the present system 1 can be executed in a shorter time than the pressurization process in the conventional pressurization device that is not able to separate the pressurization process from the cooling process.

In the present system 1, the cooling process is executed by dividing it into the primary cooling process and the secondary cooling process. Thus, in the present system 1, the workpiece W is efficiently cooled. In the present system 1, the cooling time for each workpiece W is shorter than that of the conventional pressurization device that is not able to separate the cooling process.

In this way, in the present system 1, the preheating process, the primary cooling process, and the secondary cooling process can be executed as the related processes. Thus, the total time required from the loading to the unloading of the workpiece W in the present system 1 is shorter than the total time required for the conventional pressurization device. That is, in the present system 1, the plurality of related processes is executed, thereby shortening the time between the pressurization processes compared with the time between the pressurization processes in the conventional pressurization device that is not able to execute the related processes.

The chamber unit 20 is rotated by 90 degrees in the same direction (the clockwise direction when viewed from above in the present embodiment) a total of four times in the execution areas A21, A22, A24, and A25 (the direction changing areas) through the execution areas A21 to A25. As a result, the orientation of the chamber unit 20 with respect to the moving direction of the chamber unit 20 is always the same. In this configuration, when the workpiece Wis located in the loading area A1, the orientation of the workpiece W is the same as the orientation of the workpiece W when the workpiece W is located in the unloading area A3. That is, the orientation of the workpiece W is the same in the processes before and after the processes executed by the present system 1.

In the present system 1, when the chamber unit 20 is located in the execution areas A21 to A25, the movable connector Cp is connected to each fixed connector Cs1 to Cs5, and the accommodating chamber 20R is able to communicate with the pressure reducing line Lp or the gas line Lg via the through hole 27*c*, the movable connector Cp, the fixed connectors Cs1 to Cs5, and the valves V1 to V5. While the chamber unit 20 is being conveyed, the check valve of the movable connector Cp is closed and the accommodating chamber 20R is sealed. In this configuration, even though the degree of vacuum in the accommodating chamber 20R decreases during conveying the chamber unit 20, the depressurized atmosphere in the accommodating chamber 20R is maintained in each of the execution areas A21 to A25. Thus, the oxidation of the workpiece W due to heat and the outside air is prevented.

In the present system 1, the chamber unit 20 includes the members (the placement table 21, the base member 23, the upper mold 24, and the pressurizing pad 26) that function as the upper and lower pressurizing units 6U and 6D and is conveyed through the execution areas A21 to A25. The base member 23, the upper mold 24, and the pressurizing pad 26 of the above members are conveyed through the execution areas A21 to A26. That is, these members are not installed in the execution area A23 and are conveyed to other execution areas A21, A22, and A24 to A26. Thus, in the other execution areas A21, A22, and A24 to A26, the maintenance of the chamber unit 20 and the upper unit 22 can be executed, and the maintainability thereof is improved.

In the present system 1, each process is executed in a state where one (or one set of) workpiece W is accommodated in one chamber unit 20 (the accommodating chamber 20R). That is, one chamber unit 20 is associated with one (or one set of) workpiece W. That is, one set of placement table 21 and pressurizing pad 26 is associated with one (or one set of) workpiece W. Thus, the placement table 21 and the pressurizing pad 26 used when each process is executed can be tracked for each workpiece W.

The present system 1 includes a plurality of chamber units 20 including the members that function as the upper and lower pressurizing units 6U and 6D. Thus, even though a defect occurs in these members, only removing (or replacing) the chamber unit 20 of the defected member is necessary and each process for other workpieces W can proceed.

The present system 1 includes the execution area A26 for maintenance process separately from the execution area A23. Thus, in the execution area A23, a space for the maintenance (mainly replacement of the member) is not required. Accordingly, the height of the execution area A23 (the housing 2) can be lowered.

According to the embodiment described above, the present system 1 includes a plurality of execution areas A21 to A26 and the chamber unit 20. The execution areas A21 to A26 are disposed according to an order in which the processes are executed. The chamber unit 20 accommodates the workpiece W and is conveyed through the execution areas A21 to A25. The chamber unit 20 includes the placement table 21, the pressurizing pad 26, and the side member 27. The placement table 21 is disposed below the workpiece W and functions as the lower pressurizing unit 6D. The pressurizing pad 26 is disposed above the workpiece W and functions as the upper pressurizing unit 6U. The side member 27 is disposed in such a way as to surround the entire perimeter of the workpiece W in the horizontal direction and defines the accommodating chamber 20R together with the placement table 21 and the pressurizing pad 26. According to this configuration, in each execution area A21 to A25 that has completed each process, the same process can be executed for another chamber unit 20. That is, in the present system 1, the time between the pressurization processes is shortened. In the present system 1, the placement table 21 functions as the lower pressurizing unit 6D, and the pressurizing pad 26 functions as the upper pressuring unit 6U. Thus, the pressurization process can be executed for the workpiece W accommodated in the chamber unit 20 (the accommodating chamber 20R). The chamber unit 20 that functions as the upper and lower pressurizing units 6U and 6D is not installed in the execution area A23 in which the pressurization process is executed, and the chamber unit 20 is conveyed to the other execution areas A21, A22, and A24 to A26. Thus, in the present system 1, the maintainability of the pressurizing pad 26 is improved. The present system 1 is able to track, for each workpiece W, the placement table 21 and the pressurizing pad 26 used when each process is executed. In the present system 1, the chamber unit 20 is conveyed through the execution areas A21 to A25, thereby enabling the plurality of related processes to be executed. The risk of contamination of the workpiece W with foreign matters (e.g., dust, dirt, etc.,) from outside of the chamber unit 20 is reduced.

According to the embodiment described above, the chamber unit 20 passes through the upper space in the execution areas A21 to A26 and is conveyed through the execution areas A21 to A25. In this configuration, for each execution area A21 to A25, each process can be easily executed by raising the members required for each process from below.

According to the embodiment described above, the pressurizing pad 26 is vertically movable relative to the placement table 21. That is, the pressurizing pad 26 defining the accommodating chamber 20R of the chamber unit 20 is movable relative to the placement table 21. According to this configuration, the pressurization process can be reliably executed for the workpiece W accommodated in the chamber unit 20 (the accommodating chamber 20R).

According to the embodiment described above, the pressurizing pad 26 includes the flexible layer 26*a* that is deformable to conform to the shape of the surface of the workpiece W in the pressurization process. The chamber unit 20 includes the upper mold 24 that is disposed above the pressurizing pad 26 and functions as the upper pressurizing unit 6U by pressurizing the pressurizing pad 26 downward in the pressurization process. According to this configuration, in the pressurization process, the alignment of the pressurizing pad 26 with respect to the upper mold 24 for each chamber unit 20 is not required. The alignment of the upper mold 24 and the pressurizing pad 26 with respect to the workpiece W is also not required. Most of the upper pressurizing unit 6U is conveyed as the chamber unit 20. Thus, conveying the chamber unit 20 to the execution area A23 is easy, and the number of members that function as the upper pressurizing unit 6U disposed in the upper space of the execution area A23 is also reduced.

According to the embodiment described above, the pressurization device 6 includes the heating unit 61 that functions as the lower pressurizing unit 6D by raising the chamber unit 20 from below and abutting on the placement table 21 in the pressurization process. In this configuration, the upper space of the execution area A23 can be used only for conveying the chamber unit 20, and the member configuration in the upper space can be simplified. Most of the mechanism that applies the main pressing force to the workpiece W (in particular, the raising and lowering device 62) is disposed below the chamber unit 20, and thus the height of the housing 2 can be restrained.

According to the embodiment described above, the atmosphere in the accommodating chamber 20R is a depressurized atmosphere in which the internal pressure in the accommodating chamber 20R is lower than the external pressure in the outer space of the chamber unit 20. The placement table 21 is disposed below the side member 27 and is attached to the side member 27 by the pressure difference. According to this configuration, an individual member for attaching the placement table 21 to the side member 27 is not required. That is, the number of components in the chamber unit 20 decreases. In each process, the workpiece W is not exposed to the outside air. Thus, the oxidation of the workpiece W due to the heat and the outside air is prevented.

According to the embodiment described above, the placement table 21 functions as the conveyor pallet that loads the workpiece W into the execution area A21 and unloads the pressurized workpiece W from the execution area A25. According to this configuration, each process from loading to unloading of the workpiece W in the present system 1 can be completed on one placement table 21.

According to the embodiment described above, the present system 1 includes the execution area A26. According to this configuration, the maintenance of the upper unit 22 can also be performed in a series of the pressurization process and the related processes. The height of the execution area A23 (the housing 2) can be lowered.

According to the embodiment described above, the present system 1 includes the preheating unit 51, the heating unit 61, the primary cooling unit 71, and the secondary cooling unit 81. When the preheating process is executed in the execution area A22, the preheating unit 51 is raised from below the chamber unit 20, thereby abutting on the placement table 21 and preheating the workpiece W. When the primary cooling process is executed in the execution area A24, the primary cooling unit 71 is raised from below the chamber unit 20, thereby abutting on the placement table 21 and cooling the workpiece W. When the secondary cooling process is executed in the execution area A25, the secondary cooling unit 81 is raised from below the chamber unit 20, thereby abutting on the placement table 21 and cooling the workpiece W. According to this configuration, the pressurization process can be executed in a short time. Accordingly, the time between the pressurization processes is shortened.

According to the embodiment described above, the present system 1 includes the plurality of chamber units 20. The number of the chamber units 20 is smaller than the number of the execution areas A21 to A26. According to this configuration, the time between the related processes as well as between the pressurization processes is shortened. All the chamber units 20 need not be conveyed at the same time, and thus conveying the chamber units 20(A to E) can be executed based on the completion of the process with the longest processing time.

According to the embodiment described above, the execution areas A21 to A26 are disposed annularly according to the order in which the processes are executed. Each of the chamber units 20 and the upper units 22 is conveyed in such a way as to make a circuit through the execution areas A21 to A26 repeatedly. According to this configuration, the present system 1 is able to continuously load the workpiece W, and each process for each loaded workpiece W can be continuously executed and different processes for different workpieces W can be concurrently executed. As a result, continuous processes for the plurality of workpieces W can be efficiently executed.

According to the embodiment described above, the present system 1 includes the rotation mechanisms 91 to 94 that change the moving direction of the chamber unit 20 in such a way that the orientation of the chamber unit 20 in the moving direction is always the same. The execution areas A21 to A26 include the direction changing areas in which the rotation mechanisms 91 to 94 are disposed. According to this configuration, the orientation of the workpiece W is adjustable in the processes before and after the processes executed by the present system 1. The floor area of the housing 2 can be made small.

According to the embodiment described above, the present system 1 includes the atmosphere adjustment device 10.

The atmosphere adjustment device 10 includes the vacuum pump P, the pressure reducing line Lp, the gas line Lg, and fixed connectors Cs1 to Cs5. The chamber unit 20 includes the movable connector Cp and the through hole 27*c*. When the chamber unit 20 is located in the execution areas A21 to A25 in which the fixed connectors Cs1 to Cs5 are disposed, the movable connector Cp is connected to each fixed connector Cs1 to Cs5, and the accommodating chamber 20R is able to communicate with the pressure reducing line Lp or the gas line Lg. While the chamber unit 20 is being conveyed, the accommodating chamber 20R is sealed. According to this configuration, even though the degree of vacuum of the accommodating chamber 20R decreases during conveying the chamber unit 20, the depressurized atmosphere in the accommodating chamber 20R is maintained in each of the execution areas A21 to A25.

EXAMPLES

Next, modification examples of the present system 1 will be described below with a focus on differences from the above-described embodiment (hereinafter referred to as "first embodiment"). In the following modification examples, the same members and the members with a common function as in the first embodiment are indicated with the same reference signs as in the first embodiment for convenience of description. In the following modification examples, FIGS. 1 to 5 will be referred to as appropriate.

Example 1

In the first modification example, the configuration of the chamber unit and the atmosphere in the accommodating chamber are different from those in the first embodiment.

Figure 21:
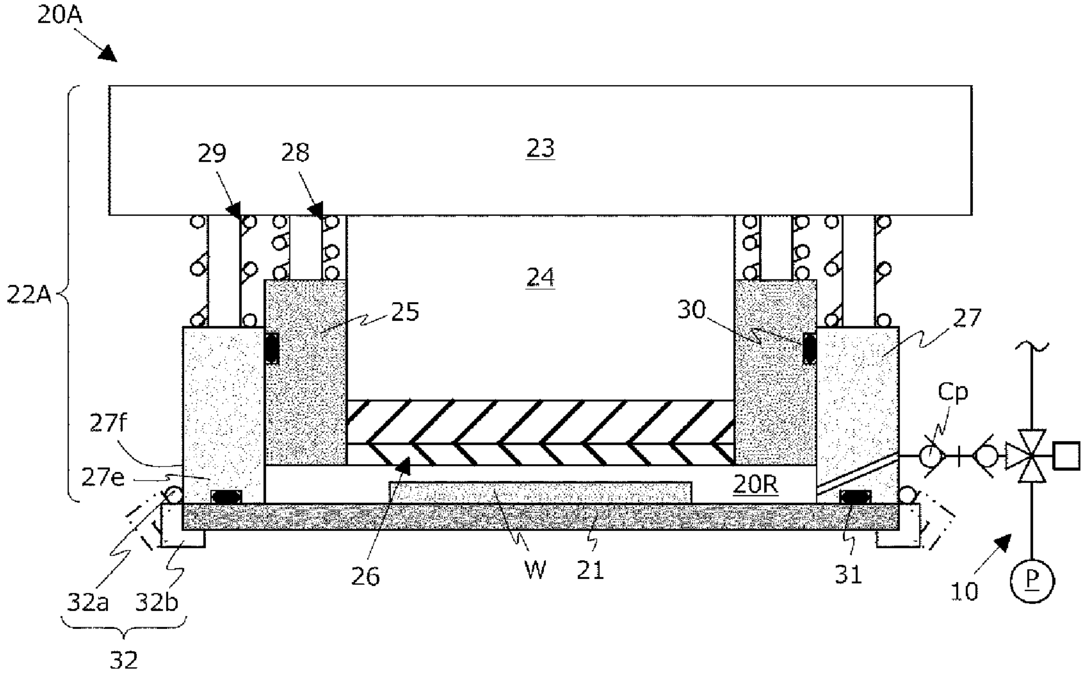
FIG. 21 is a schematic sectional view of a chamber unit in a first modification example.

FIG. 21 is a schematic sectional view of a chamber unit 20A in the first modification example.

The chamber unit 20A includes the placement table 21, an upper unit 22A, and the accommodating chamber 20R. The upper unit 22A includes the base member 23, the upper mold 24, the frame member 25, the pressurizing pad 26, the side member 27, the first spring members 28, the second spring members 29, two sealing members 30 and 31, a plurality of fixing members 32, and the movable connector Cp.

The fixing member 32 fixes the placement table 21 to the side member 27 (the upper unit 22A). The fixing member 32 is attached to an outer peripheral surface 27*f* of the lower portion of the side member 27. The fixing member 32 includes a support portion 32*a*, a main body 32*b*, and a known ratchet mechanism (not illustrated, the same applies below), for example. The support portion 32*a* rotatably supports the main body 32*b* between a fixed position and an open position. The main body 32*b* has an L shape when viewed from the side, for example. The main body 32*b* is rotatable toward the open position side and non-rotatable toward the fixed position side due to the ratchet mechanism, and the main body 32*b* is rotatable to the fixed position when the ratchet mechanism is released, for example. When the main body 32*b* is located in the fixed position, a part of the main body 32*b* is located below the placement table 21 and the side member 27 and is able to support the placement table 21. When the main body 32*b* is located in the open position, a part of the main body 32*b* is located on the side of the side member 27 and is not able to support the placement table 21.

When the workpiece W is accommodated in the chamber unit 20A, the atmosphere in the accommodating chamber 20R is adjusted to the inert gas atmosphere by the atmosphere adjustment device 10. That is, the accommodating chamber 20R is filled with the inert gas in such a way to equalize the internal pressure in the accommodating chamber 20R with the external pressure (the atmospheric pressure). In this case, since the vacuum pressure does not occur, the placement table 21 is fixed to the side member 27 (the upper unit 22A) by the fixing member 32 that rotates to the fixed position. As described above, the movable connector Cp is connected to each of the fixed connectors Cs1 to Cs5, and the atmosphere of the accommodating chamber 20R can be maintained in each of the execution areas A21 to A25. Thus, a small gap may occur between the placement table 21 and the sealing member 31.

In this configuration, the atmosphere of the accommodating chamber 20R is the inert gas atmosphere, and thus the workpiece W is not exposed to the outside air in the preheating process, the pressurization process, and the primary cooling process, and the workpiece W is not oxidized. The required amount of the inert gas is reduced to the amount of the volume of the accommodating chamber 20R, i.e., the amount obtained by multiplying the volume by the number of times of gas replacement when several times of replacement are executed.

Note that, in the first modification example, when the workpiece W is made of a material that is not oxidized (hardly oxidized), the accommodating chamber 20R may be filled with air.

In the first modification example, the configuration of the fixing member 32 is not limited to the support portion 32*a*, the main body 32*b*, and a known ratchet mechanism. That is, the fixing member 32 may have a rectangular "C" shape when viewed from the side, for example. In this case, a recess portion or a convex portion into which the fixing member 32 is fitted is formed on the outer peripheral surface 27*f* of the lower end portion 27*e* of the side member 27, and the fixing member 32 sandwiches the lower end portion 27*e* of the side member 27 and an outer edge portion of the placement table 21. The fixing member 32 may be a bolt that fastens the outer edge portion of the placement table 21 and the side member 27, for example. The accommodating device 4 may include an attaching mechanism for the fixing member 32, and the removal device 8 may include a removing mechanism for the fixing member 32.

Examples 2-4

In the second to fourth modification examples, the arrangement of the execution areas and the configuration of the conveying device are different from those in the first embodiment.

Figures 22A, 22B, 22C:
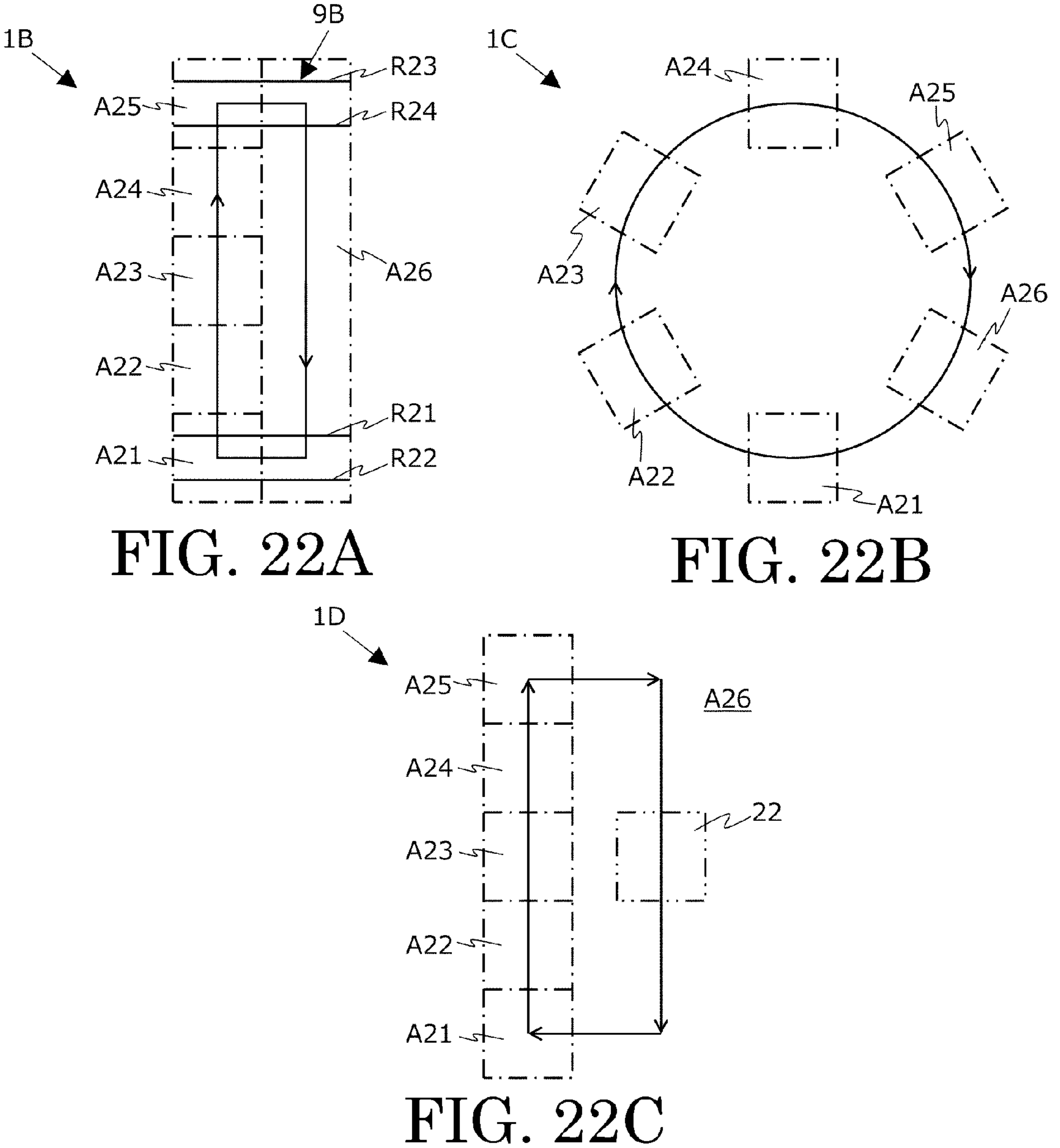
FIG. 22A is a schematic plan view of a pressurization system according to a second modification example.
FIG. 22B is a schematic plan view of a pressurization system according to a third modification example.
FIG. 22C is a schematic plan view of a pressurization system according to a fourth modification example.

FIG. 22A is a schematic plan view of a pressurization system 1B according to the second modification example (hereinafter referred to as "present system 1B"), FIG. 22B is a schematic plan view of a pressurization system 1C according to the third modification example (hereinafter referred to as "present system 1C"), and FIG. 22C is a schematic plan view of a pressurization system 1D according to the fourth modification example (hereinafter referred to as "present system 1D"). For convenience of description, the figures illustrate only the execution areas A21 to A25 (A26) with dash-dotted lines. The figures illustrate a convey path of the chamber unit 20 or the upper unit 22 with arrows. The members not illustrated in FIG. 22 will be referred to in FIGS. 1 to 5.

As illustrated in FIG. 22A, the execution areas A21 to A25 are disposed in a straight line, and the execution area A26 is disposed on the side of the execution areas A21 to A25 in the present system 1B. A conveying device 9B includes second rail members R21 to R24 and does not include the rotation mechanisms 91 to 94. The second rail members R21 and R22 are disposed in the execution areas A21 and A26, and the second rail members R23 and R24 are disposed in the execution areas A25 and A26. The base member B1 is supported by the second rail members R21 and R22 and is configured to be able to translate between the execution areas A21 and A26. The base member B4 is supported by the second rail members R23 and R24 and is configured to be able to translate between the execution areas A25 and A26. In this configuration, even though the conveying device 9B does not include the rotation mechanisms 91 to 94, the orientation of the workpiece W is the same in the processes before and after the processes by the present system 1B. In this configuration, the plurality of upper units 22 can be stored in the execution area A26, and thus the total number of the chamber unit 20 and the upper unit 22 can be set to be equal to or larger than the number of the execution areas A21 to A26.

Note that, in the second modification example, the execution area A26 may be disposed above the execution areas A21 to A25. That is, the execution areas A21 to A26 may be disposed in a three-dimensional shape like a caterpillar, for example.

As illustrated in FIG. 22B, the execution areas A21 to A26 are disposed annularly in the present system 1C. A conveying device 9C does not include the rotation mechanisms 91 to 94. When viewed from above, the rail members R1 to R16 are disposed annularly. In this configuration, even though the conveying device 9C does not include the rotation mechanisms 91 to 94, the orientation of the workpiece W is the same in the processes before and after the processes by the present system 1C. In this configuration, a standby area of the chamber unit 20 can be disposed through the execution areas A21 to A26. Thus, the total number of the chamber unit 20 and the upper unit 22 can be set to be equal to or larger than the number of the execution areas A21 to A26.

As illustrated in FIG. 22C, the execution areas A21 to A25 are disposed in a straight line in the present system 1D. In the execution area A21, the upper unit 22 is set to the rail members R1 and R2 by a user, for example. In the execution area A25, the upper unit 22 is removed from the rail members R7 and R8 by a user of the present system 1D, for example. A removed upper unit 22 is conveyed to the vicinity of the execution area A21 by the user or a conveying robot. In this configuration, all the circumferences of the execution areas A21 to A25 can function as the maintenance area (the execution area A26).

Note that, in the present invention, the number of execution areas A2 may be multiple, the type of the execution area A2 may be set according to the type of the related process, and the number and the type of the execution area A2 is not limited to those of the first embodiment. That is, for example, the number of execution areas A2 may be equal to or larger than "two". Specifically, when the preheating process is not executed in the present system 1, the present system 1 need not include the execution area A22 and the preheating device 5, for example. For example, when the cooling process is not divided into two stages in the present system 1, the present system 1 need not include the execution area A24 and the primary cooling device 7. The plurality of processes, e.g., the accommodation process and the preheating process, the removal process and the maintenance process, etc., may be executed in the same execution area A2, for example. The accommodation process and/or the removal process may be executed outside the present system 1, and the chamber unit 20 may be loaded to and unloaded from the present system 1, for example. The execution area A2 may include a convey path (the above-described standby area) that allows the one or more chamber units 20 to be disposed through the execution areas A21 to A26.

In the present invention, the arrangement of the execution area A2 is not limited to that of the first embodiment as illustrated in the second to fourth modification examples.

In the present invention, only the workpiece W may be loaded on and unloaded from the present system 1. That is, in the execution area A25, the placement table 21 with only the workpiece W unloaded and no workpiece W placed may be attached to the upper unit 22 and the chamber unit 20 may be assembled, and the chamber unit 20 may be conveyed to the execution area A21, for example. In this case, the placement table 21 is removed from the upper unit 22, and only the workpiece W is loaded onto the placement table in the execution area A21. In this example, the placement table 21 in the execution area A25 may be conveyed to the execution area A21 on a path different from the upper unit 22, and the upper unit 22 may be conveyed to the execution area A21 via the execution area A26. In this example, the present system 1 need not include the loading area A1 and the unloading area A3.

In the present invention, as described above, the present system 1 need not include the preheating device 5 and/or the primary cooling device 7 (and/or the secondary cooling unit 81). Specifically, the cooling process may also be executed in the pressurization process, for example. Even in this case, the accommodation process, the removal process, and the maintenance process can be executed concurrently with the pressurization process, and the processing time between the pressurization processes can be shorter than that of the conventional pressurization devices.

In the present invention, the pressurization device 6 need not include the heating unit 61.

In the present invention, the configuration of the conveying device 9 may be such that the chamber unit 20 and the upper unit 22 are able to be conveyed in the upper space of each of the execution areas A21 to A26 and is not limited to the configuration in the first embodiment. That is, the chamber unit 20 (the upper unit 22) may include a power source and a driving wheel capable of rolling on the rail members R1 to R16, for example. A plurality of rollers capable of abutting on the lower surface 23*a* of the base member 23 may be attached to the rail members R1 to R16, for example. The conveying device 9 may include a locking member configured to be attachable to and detachable from the base member 23 and a moving mechanism that moves the locking member through the adjacent execution areas A21 to A26, for example.

In the present invention, the number of the chamber units 20 may be preferably equal to or less than the number of the execution areas A2 and is not limited to "five". That is, in the present invention, the number of the chamber units 20 may be "one", for example. In this case, although the remarkable effect as in the first embodiment is not exhibited, the total time from the loading to the unloading is shortened compared with the conventional pressurization device that executes the process from the heating to the cooling in a single pressurization process. Accordingly, the time between the pressurization processes is shortened compared with that of the conventional pressurization device.

In the present invention, the number of the rotation mechanisms 91 to 94 and the direction of the rotation are not limited to those in the first embodiment. That is, when the orientation of the workpiece W may be different in the processes before and after the processes by the present system 1, a part or all of the rotation mechanisms 91 to 94 may be rotated by 90 degrees in the counterclockwise direction when viewed from above, for example.

In the present invention, the rail members R1 to R8 may be configured to be able to enter and exit only from one direction side in the longitudinal direction in order to reduce the risk of falling of the chamber unit 20 (the upper unit 22) during rotation.

In the present invention, the present system 1 need not include a part or all of the fixed connectors Cs2 to Cs5.

In the present invention, the present system 1 need not include the fixed connectors Cs1 to Cs5 and the movable connector Cp. In this case, the accommodating chamber 20R is filled with the outside air (the air) of the chamber unit 20.

In the present invention, the anti-adhesive sheet need not be covered over the workpiece W.

In the drawings, the shape of the workpiece W accommodated in the chamber unit 20 is illustrated in a single flat plate shape for convenience of description, but the shape of the workpiece W is not limited thereto. That is, the chamber unit 20 may accommodate one set of workpieces W including a plurality of workpieces to be pressurized, for example. Each shape of the workpieces included in the one set of workpieces W may be identical or different, for example.

Next, aspects of the present invention conceived from the embodiments described above will be described below with reference to the terms and reference signs described in the embodiments.

A first aspect of the present invention is a pressurization system (e.g., the pressurization system 1, 1B to 1D) that executes a pressurization process for a workpiece (e.g., workpiece W) and a related process related to the pressurization process, the system including a plurality of execution areas (e.g., the execution areas A21 to A26) in which any one of a plurality of processes including the pressurization process and the related process is executed, and a chamber unit (e.g., the chamber unit 20, 20A) that accommodates the workpiece and is conveyed through the plurality of execution areas, in which the plurality of execution areas is disposed according to an order in which the processes are executed, and the chamber unit includes a ceiling portion (e.g., the pressurizing pad 26) that is disposed above the workpiece and functions as an upper pressurizing unit (e.g., the upper pressurizing unit 6U) that pressurizes the workpiece from above in the pressurization process, a floor portion (e.g., the placement table 21) that is disposed below the workpiece and functions as a lower pressurizing unit (e.g., the lower pressurizing unit 6D) that pressurizes the workpiece from below in the pressurization process, and a peripheral wall portion (e.g., the side member 27) that is disposed in such a way as to surround the entire perimeter of the workpiece and defines, together with the ceiling portion and the floor portion, an accommodating chamber (e.g., the accommodating chamber 20R) in which the workpiece is accommodated. According to this configuration, the time between the pressurization processes can be shortened, and the related processes of the pressurization process can be executed.

A second aspect of the present invention is the pressurization system in the first aspect, in which the chamber unit passes through an upper space in the execution areas and is conveyed through the execution areas. According to this configuration, each process can be easily executed.

A third aspect of the present invention is the pressurization system in the first aspect, in which the ceiling portion is vertically movable relative to the floor portion. According to this configuration, the pressurization process can be reliably executed for the workpiece accommodated in the chamber unit (the accommodating chamber).

A fourth aspect of the present invention is the pressurization system in the third aspect, in which the ceiling portion includes a pressurizing pad (e.g., the pressurizing pad 26) including a flexible layer (e.g., the flexible layer 26*a*) that is deformable to conform to a shape of a surface of the workpiece in the pressurization process, and the chamber unit includes an upper mold (e.g., the upper mold 24) disposed above the pressurizing pad and configured to function as the upper pressurizing unit by pressurizing the pressurizing pad downward in the pressurization process. According to this configuration, the chamber unit can be easily conveyed to the execution area (the pressurization area), and the number of members that function as the upper pressurizing unit disposed in the upper space of the execution area is also reduced.

A fifth aspect of the present invention is the pressurization system in the first aspect, further including a pressurization device (e.g., the pressurization device 6) disposed in a pressurization area (e.g., the execution area A23) where the pressurization process is executed and configured to execute the pressurization process, the execution area includes the pressurization area, and the pressurization device includes a pressurizing unit (e.g., the heating unit 61) that abuts on the floor portion by being raised from below the chamber unit in the pressurization process and functions as the lower pressurizing unit. According to this configuration, the member configuration in the upper space of the execution area (the pressurization area) can be simplified. The height of the housing can be restrained.

A sixth aspect of the present invention is the pressurization system in the first aspect, in which an atmosphere in the accommodating chamber is a depressurized atmosphere in which an internal pressure in the accommodating chamber is lower than an external pressure in outer space of the chamber unit, and the floor portion is disposed below the peripheral wall portion and is attached to the peripheral wall portion by a pressure difference between the internal pressure and the external pressure. According to this configuration, the workpiece is not exposed to the outside air in each process.

A seventh aspect of the present invention is the pressurization system in the first aspect, in which the atmosphere in the accommodating chamber is a gas atmosphere where gas is filled in such a way as to equalize an internal pressure in the accommodating chamber with an external pressure in outer space of the chamber unit, and the chamber unit (e.g., the chamber unit 20A) includes a fixing member (e.g., the fixing member 32) that fixes the floor portion to the peripheral wall portion. According to this configuration, the inert gas is used for the gas, and thus the workpiece is not exposed to the outside air in each process.

An eighth aspect of the present invention is the pressurization system in the first aspect, in which the floor portion is attachable to and detachable from the peripheral wall portion, the plurality of execution areas includes: an accommodating area (e.g., the execution area A21) where an accommodation process is executed as the related process, the accommodation process in which the floor unit on which the workpiece is placed is attached to the peripheral wall portion, thereby accommodating the workpiece in the chamber unit; and a removal area (e.g., the execution area A25) where a removal process is executed as the related process, the removal process in which the floor portion on which the pressurized workpiece is placed is removed from the peripheral wall portion, thereby removing the workpiece from the chamber unit, and the floor unit functions as a conveyor pallet that loads the workpiece into the accommodating area and unloads the pressurized workpiece from the removal area. According to this configuration, each process from loading to unloading of the workpiece in the present system can be completed on one placement table.

A ninth aspect of the present invention is the pressurization system in the eighth aspect, further including a maintenance area (e.g., the execution area A26) disposed between the accommodation area and the removal area, the maintenance area in which a maintenance process of the chamber unit (e.g., the upper unit 22) from which the floor portion is removed is executed. According to this configuration, maintenance of the upper unit can be executed, and the height of the execution area (the pressurization area) can be lowered.

A tenth aspect of the present invention is the pressurization system in the first aspect, further including a heating unit (e.g., the heating unit 61) disposed in a pressurization area where the pressurization process is executed and that heats the workpiece, and a preheating unit (e.g., the preheating unit 51) that preheats the workpiece and/or a cooling unit (e.g., the primary cooling unit 71, the secondary cooling unit 81) that cools the workpiece after the pressurization, in which the plurality of execution areas includes a preheating area (e.g., the execution area A22) in which the preheating unit is disposed and a preheating process for the workpiece is executed as the related process and/or a cooling area (e.g., the execution areas A24 and A25) in which the cooling unit is disposed and a cooling process for the workpiece after the pressurization is executed as the related process, and the preheating unit abuts, when the preheating process is executed, on the floor portion by being raised from below the chamber unit in the preheating area, and/or the cooling unit abuts, when the cooling process is executed, on the floor portion by being raised from below the chamber unit in the cooling area. According to this configuration, the time between the pressurization processes is shortened.

An eleventh aspect of the present invention is the pressurization system in any one of the first to the tenth aspects, further including a plurality of the chamber units, in which the number of the plurality of chamber units is equal to or less than the number of the plurality of execution areas. According to this configuration, the time between the related processes as well as between the pressurization processes is shortened.

A twelfth aspect of the present invention is the pressurization system in the eleventh aspect, in which the plurality of execution areas is disposed annularly according to an order in which the processes are executed, and each of the plurality of chamber units is conveyed in such a way as to make a circuit through the plurality of execution area. According to this configuration, continuous processes for a plurality of workpieces can be efficiently executed.

A thirteenth aspect of the present invention is the pressurization system (e.g., the pressurization system 1) in the twelfth aspect, further including a direction changing mechanism (e.g., the rotation mechanisms 91 to 94) that changes a moving direction of the chamber unit in such a way that an orientation of the chamber unit in the moving direction of the chamber unit is always the same, in which the plurality of execution areas includes a direction changing area (e.g., the execution areas A21, A22, A24, and A25) in which the direction changing mechanism is disposed. According to this configuration, the orientation of the workpiece can be adjusted in the processes before and after the processes executed by the present system. The floor area of the housing can be made small.

A fourteenth aspect of the present invention is the pressurization system in the sixth or seventh aspect, further including a vacuum pump (e.g., the vacuum pump P), a pressure reducing line (e.g., the pressure reducing line Lp) connected to the vacuum pump, a gas line (e.g., the gas line Lg) connected to a supply system line for inert gas, and a plurality of fixed connectors (e.g., the fixed connectors Cs1 to Cs5) disposed in each of two or more execution areas out of the plurality of execution areas and connected to the pressure reducing line and the gas line, in which the chamber unit includes a movable connector (e.g., the movable connector Cp) that is attachable to and detachable from the fixed connector and a through path (e.g., the through hole 27*c*) that communicates the accommodating chamber with the movable connector, when the chamber unit is located in the execution areas in which the fixed connectors are disposed, the movable connector is connected to the fixed connector and the accommodating chamber is able to communicate with the pressure reducing line or the gas line, and while the chamber unit is being conveyed, the accommodating chamber is sealed. According to this configuration, the depressurized atmosphere in the accommodating chamber is maintained in each execution area.

What is claimed is:

1. A pressurization system for executing a pressurization process for a workpiece and a related process related to the pressurization process, the pressurization system comprising:

a plurality of execution areas in which any one of a plurality of processes including the pressurization process and the related process is executed;

a chamber unit configured to accommodate the workpiece and conveyed through the plurality of execution areas;

a raising and lowering device disposed in each of the execution areas;

a conveying device configured to convey the chamber unit;

a heating unit configured to heat the workpiece; and a preheating unit configured to preheat the workpiece and/or a cooling unit configured to cool the workpiece after the pressurization, wherein the plurality of execution areas is disposed according to an order in which the processes are executed, and the chamber unit includes a ceiling portion disposed above the workpiece including a pressurizing pad having a flexible layer that is deformable to conform to a shape of a surface of the workpiece and configured to function as an upper pressurizing unit that pressurizes the workpiece from above in the pressurization process, a floor portion disposed below the workpiece and configured to function as a lower pressurizing unit that pressurizes the workpiece from below in the pressurization process, a peripheral wall portion disposed in such a way as to surround an entire perimeter of the workpiece and configured to define, together with the ceiling portion and the floor portion, an accommodating chamber in which the workpiece is accommodated, and an upper mold disposed above the pressurizing pad and configured to function as the upper pressurizing unit by pressurizing the pressurizing pad downward in the pressurization process, the plurality of execution areas includes a pressurizing area in which the heating unit is disposed and a pressurizing process for the workpiece is executed, and a preheating area in which the preheating unit is disposed and a preheating process for the workpiece is executed as the related process and/or a cooling area in which the cooling unit is disposed and a cooling process for the workpiece after the pressurization is executed as the related process, the raising and lowering device disposed in the pressurizing area raises and lowers the heating unit, the raising and lowering device disposed in the preheating area raises and lowers the preheating unit, and/or the raising and lowering device disposed in the cooling area raises and lowers the cooling unit, the heating unit abuts, when the pressurizing process is executed, on the floor portion by being raised from below the chamber unit in the pressurizing area, the preheating unit abuts, when the preheating process is executed, on the floor portion by being raised from below the chamber unit in the preheating area, and/or the cooling unit abuts, when the cooling process is executed, on the floor portion by being raised from below the chamber unit in the cooling area, the pressurizing area, the preheating area, and/or the cooling area include a raising and lowering space in which the heating unit, the preheating unit, and/or the cooling unit can be elevated and lowered above the raising and lowering device, and an upper space located above the raising and lowering space, the conveying device is disposed in the upper space, and the chamber unit passes through the upper space and is conveyed through the execution areas.

2. The pressurization system according to claim 1, wherein the ceiling portion is vertically movable relative to the floor portion.

3. The pressurization system according to claim 1, further comprising a pressurization device disposed in the pressurization area and configured to execute the pressurization process, wherein the pressurization device includes a pressurizing unit configured to function as the lower pressurizing unit in the pressurization process.

4. The pressurization system according to claim 1, wherein an atmosphere in the accommodating chamber is a depressurized atmosphere in which an internal pressure in the accommodating chamber is lower than an external pressure in outer space of the chamber unit, and the floor portion is disposed below the peripheral wall portion and is attached to the peripheral wall portion by a pressure difference between the internal pressure and the external pressure.

5. The pressurization system according to claim 4, further comprising:

a vacuum pump;

a pressure reducing line connected to the vacuum pump;

a gas line connected to a supply system line for inert gas; and a plurality of fixed connectors disposed in each of two or more execution areas out of the plurality of execution areas and connected to the pressure reducing line and the gas line, wherein the chamber unit includes a movable connector that is attachable to and detachable from the fixed connector and a through path configured to communicate the accommodating chamber with the movable connector, when the chamber unit is located in the execution areas in which the fixed connectors are disposed, the movable connector is connected to the fixed connector and the accommodating chamber is able to communicate with the pressure reducing line or the gas line, and while the chamber unit is being conveyed, the accommodating chamber is sealed.

6. The pressurization system according to claim 1, wherein an atmosphere in the accommodating chamber is a gas atmosphere where gas is filled in such a way as to equalize an internal pressure in the accommodating chamber with an external pressure in outer space of the chamber unit, and the chamber unit includes a fixing member configured to fix the floor portion to the peripheral wall portion.

7. The pressurization system according to claim 6, further comprising:

a vacuum pump;

a pressure reducing line connected to the vacuum pump;

a gas line connected to a supply system line for inert gas; and a plurality of fixed connectors disposed in each of two or more execution areas out of the plurality of execution areas and connected to the pressure reducing line and the gas line, wherein the chamber unit includes a movable connector that is attachable to and detachable from the fixed connector and a through path configured to communicate the accommodating chamber with the movable connector, when the chamber unit is located in the execution areas in which the fixed connectors are disposed, the movable connector is connected to the fixed connector and the accommodating chamber is able to communicate with the pressure reducing line or the gas line, and while the chamber unit is being conveyed, the accommodating chamber is sealed.

8. The pressurization system according to claim 1, wherein the floor portion is attachable to and detachable from the peripheral wall portion, the plurality of execution areas includes an accommodating area where an accommodation process is executed as the related process, the accommodation process in which the floor unit on which the workpiece is placed is attached to the peripheral wall portion, thereby accommodating the workpiece in the chamber unit, and a removal area where a removal process is executed as the related process, the removal process in which the floor portion on which the pressurized workpiece is placed is removed from the peripheral wall portion, thereby removing the workpiece from the chamber unit, and the floor unit is configured to function as a conveyor pallet that loads the workpiece into the accommodating area and unloads the pressurized workpiece from the removal area.

9. The pressurization system according to claim 8, further comprising a maintenance area disposed between the accommodation area and the removal area, the maintenance area in which a maintenance process of the chamber unit from which the floor portion is removed is executed.

10. The pressurization system according to claim 1, further comprising a plurality of the chamber units, wherein the plurality of chamber units is equal in number to or less than the plurality of execution areas.

11. The pressurization system according to claim 10, wherein the plurality of execution areas is disposed annularly according to an order in which the processes are executed, and each of the plurality of chamber units is conveyed in such a way as to make a circuit through the plurality of execution areas.

12. The pressurization system according to claim 11, further comprising a direction changing mechanism configured to change a moving direction of the chamber unit in such a way that an orientation of the chamber unit in the moving direction of the chamber unit is always identical, wherein the plurality of execution areas includes a direction changing area in which the direction changing mechanism is disposed.

* * * * *